(12) United States Patent
Kim

(10) Patent No.: US 7,933,160 B2
(45) Date of Patent: Apr. 26, 2011

(54) HIGH SPEED CARBON NANOTUBE MEMORY

(76) Inventor: Juhan Kim, San Jose, CA (US)

( * ) Notice: Subject to any disclaimer, the term of this patent is extended or adjusted under 35 U.S.C. 154(b) by 370 days.

(21) Appl. No.: 12/334,443

(22) Filed: Dec. 13, 2008

(65) Prior Publication Data

US 2010/0149895 A1 Jun. 17, 2010

(51) Int. Cl.
*G11C 7/02* (2006.01)
(52) U.S. Cl. ............... 365/207; 365/189.05; 365/189.15
(58) Field of Classification Search .................. 365/207, 365/189.05, 189.15, 189.16, 230.06, 230.08
See application file for complete search history.

(56) References Cited

U.S. PATENT DOCUMENTS

| | | | |
|---|---|---|---|
| 7,112,493 B2 | 9/2006 | Bertin et al. | |
| 7,113,426 B2 | 9/2006 | Rueckes et al. | |
| 7,115,901 B2 | 10/2006 | Bertin et al. | |
| 7,443,714 B1 * | 10/2008 | Kim | 365/149 |
| 7,675,768 B1 * | 3/2010 | Kim | 365/149 |
| 2009/0303801 A1 * | 12/2009 | Kim | 365/189.05 |
| 2010/0149895 A1 * | 6/2010 | Kim | 365/207 |

* cited by examiner

*Primary Examiner* — Gene N. Auduong

(57) ABSTRACT

In order to realize high speed carbon nanotube memory, bit line is multi-divided into short lines for reducing parasitic capacitance. For reading, a small local sense amp is composed of a local pre amplifier and a local main amplifier with high gain, and a simple global sense amp is composed of an inverter as amplifying circuit for receiving an output of the local sense amp through a global bit line. By the sense amps, time domain sensing scheme is realized such that a voltage difference in the bit line is converted to a time difference as an output of the global sense amp, for differentiating high data and low data. In this manner, fast read operation is realized with fast sensing circuit. And alternative circuits are described. Particularly, field-effect alignment process is realized for aligning the carbon nanotubes on exact location of the memory cell, when forming the memory cell.

20 Claims, 14 Drawing Sheets

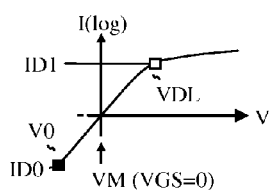
FIG. 2B
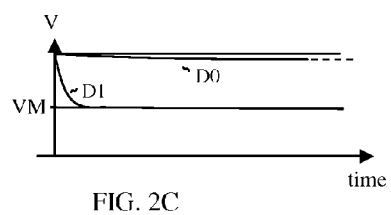
FIG. 2C
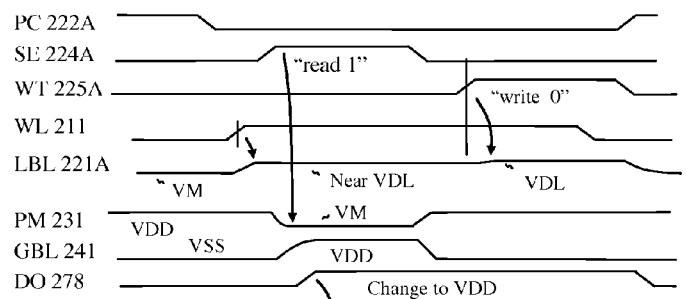
FIG. 2D
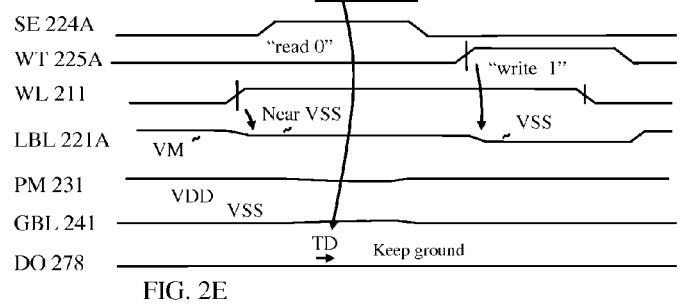
FIG. 2E
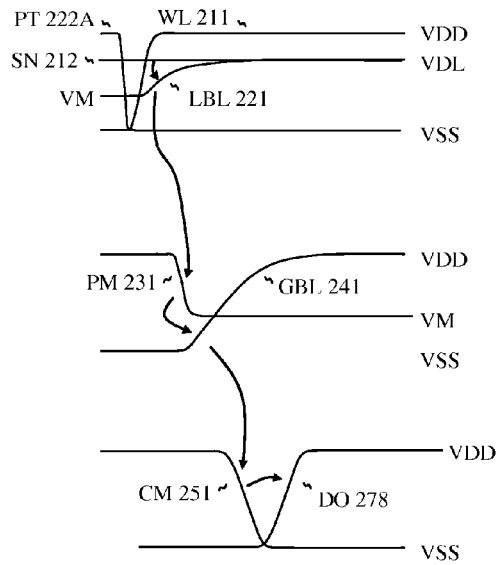
FIG. 2F    Data "1"
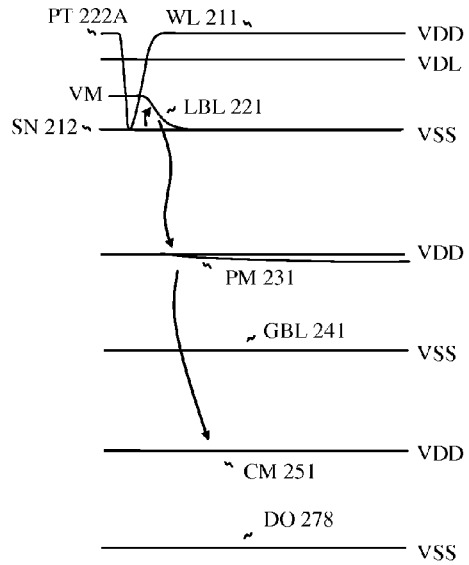
FIG. 2G    Data "0"

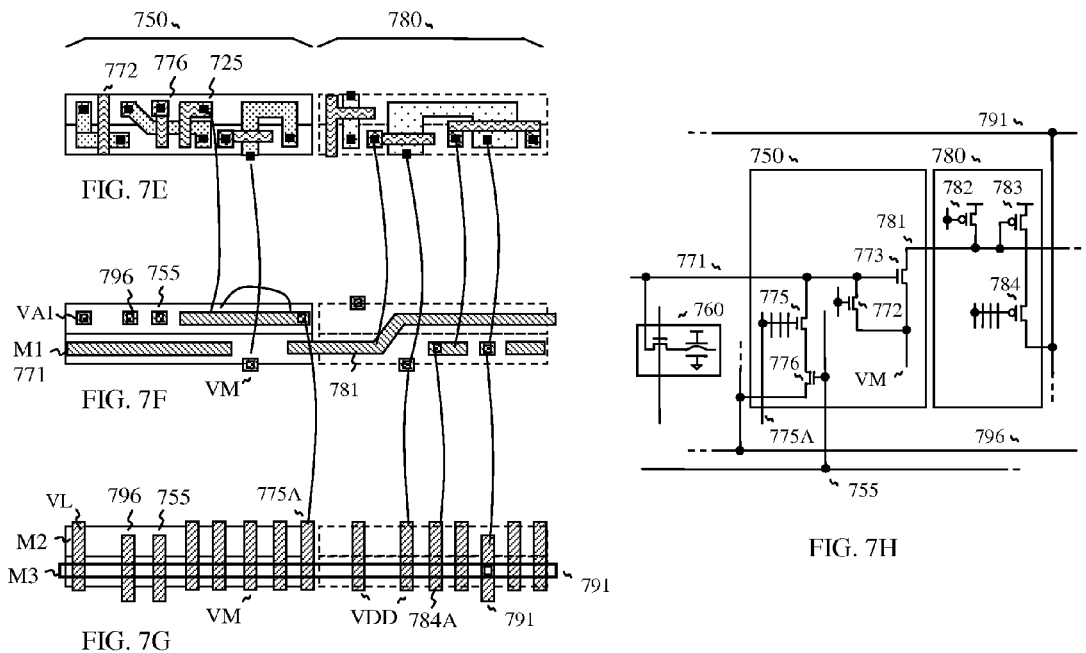
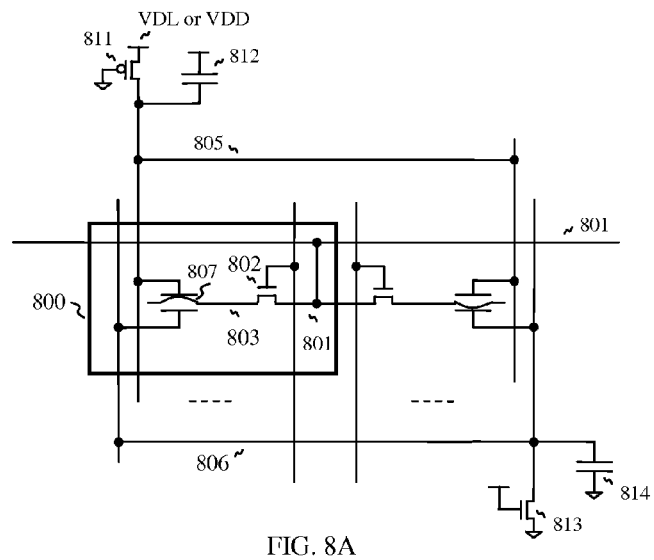

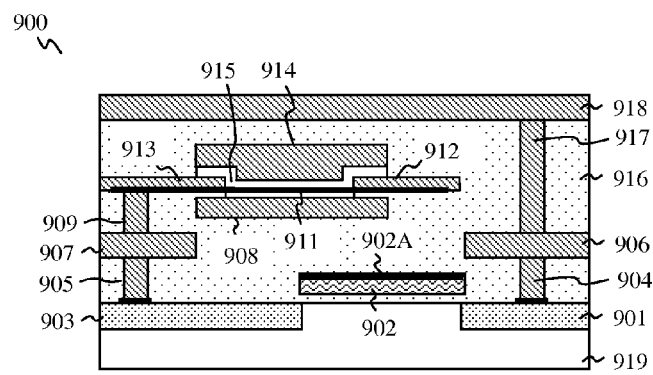
FIG. 9G
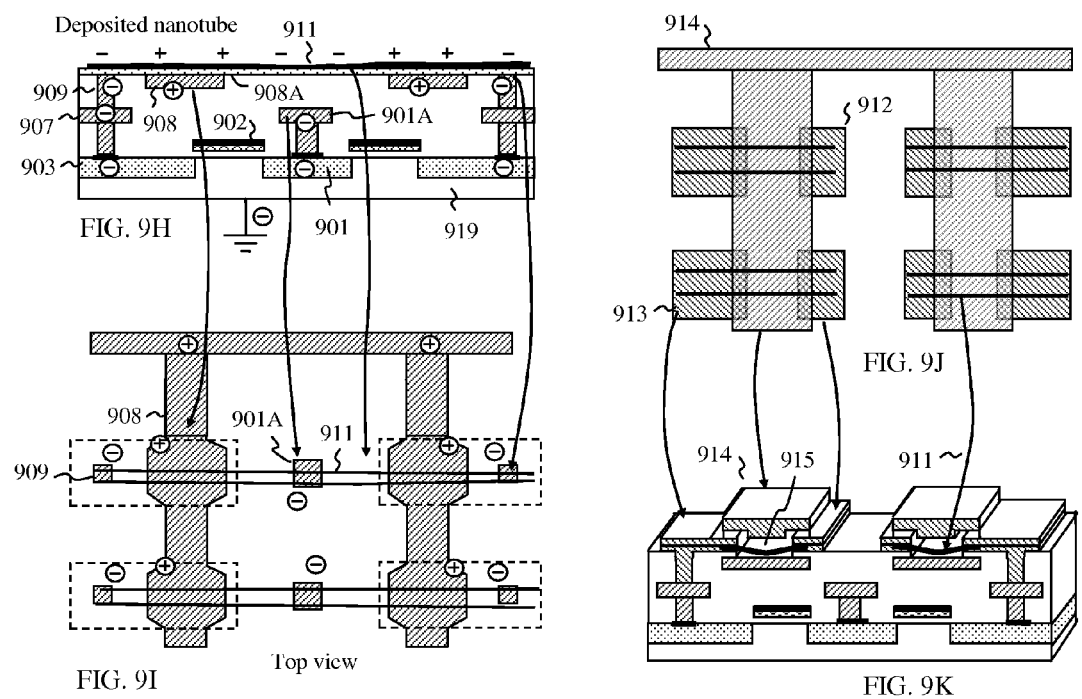
FIG. 9H
FIG. 9I
FIG. 9J
FIG. 9K

HIGH SPEED CARBON NANOTUBE MEMORY

FIELD OF THE INVENTION

The present invention relates generally to integrated circuits, in particular to high speed carbon nanotube memory.

BACKGROUND OF THE INVENTION

Carbon nanotube has been demonstrated to have remarkable physical, electrical and thermal properties, and is likely to find numerous applications such as a high-speed and high-density nonvolatile memory. In order to store data, the carbon nanotube is bended to one of two electrodes, which exhibits high voltage or low voltage depending on the bended carbon nanotube.

In FIG. 1A, a prior art of carbon nanotube-based memory circuit including carbon nanotube and sense amplifier is illustrated, as published, U.S. Pat. No. 7,112,493, U.S. Pat. No. 7,115,901 and U.S. Pat. No. 7,113,426. The memory cell 130 is consisted of MOS transfer transistor 132 and carbon nanotube storage element (NT). The transfer gate 132, the drain/source 134 and 135 configure MOS transistor. And storage node (SN), reference node (REF) and release node (RN) configure the storage element. The storage node (SN) is connected to drain/source region 134 of the MOS transistor, carbon nanotube (NT) is connected to reference node (REF), and release node is connected to release line (RL). The word line 131 is connected to the gate 132, and the bit line 136 is connected to the drain/source 135. The bit line 136 is also connected to a sense amplifier 137. The sense amplifier 137 compares the difference of the voltage (or current) between that of bit line 136 and voltage reference (VREF).

The carbon nanotube stores binary states, such as the ON state shown in FIG. 1B and the OFF state shown in FIG. 1C. A small parasitic capacitance exists between SN 151, NT 152 and RN 153. In the ON state as shown in FIG. 1B, NT 152 is flexed and held in close proximity to SN 151 by van der Waals forces, resulting in an ohmic resistance typically in the 1K to 100K ohm range between NT 152 and SN 151. In FIG. 1C, the OFF state has a bended NT 152 on node RN 153, which results in an open circuit, between NT 152 and SN 151. In order to read the stored data "1" (on state), the word line 131 in FIG. 1A is asserted to high level. Thus the bit line 136 is changed by the bended NT 152 as shown in FIG. 1B through MOS access transistor, and then the sense amplifier 137 compares the result with VREF, which is data "1". In contrast, the bit line 136 is not changed because the storage node SN 151 is isolated from NT 152 when the stored data is "0" (off state), and then the sense amplifier compares the result with VREF, which is data "0".

Even though the carbon nanotube is ultra fast (100 G~200 GHz), the access time is mostly determined by the read path through the MOS (Metal Oxide Semiconductor) access transistor and bit line, which path includes contact resistance between carbon nanotube and an electrode. Furthermore, for sensing the bit line voltage without sensing error, the sense amplifier has waiting time until the bit line is changed and reached to enough voltage difference from pre-charged voltage, such as 100 mV~200 mV. In the large memory array, the charging time (or discharging time) is relatively longer than that of decoding time because the bit line has heavy RC loading with multiple memory cells. Total resistance includes the contact resistance of the bended carbon nanotube, turn-on resistance of MOS access transistor, and resistance of the bit line. Additionally, cell-to-cell and wafer-to-wafer variations affect the sensing time. Hence, the sensing time depends on total resistance and total capacitance of the bit line. And the conventional sense amplifier is relatively big, which reduces cell efficiency.

Moreover, access time is different from location of the selected memory cell in a chip. For example, access time from the sense amp near a data output circuit is faster than that of the sense amp far from the data output circuit, so that it is difficult to latch the sense amp output at high speed, because a latching clock is fixed (not shown). Furthermore, read data line is also heavily loaded for connecting to multiple memory blocks with no buffers, which increases driving current and RC delay time as well.

In this respect, there is still a need for improving the carbon nanotube memory, such that a memory circuit should be re-invented for reading and writing data in the suspended carbon nanotube, which achieves fast access and stable operation. In the present invention, high speed carbon nanotube memory is realized with fast sensing circuit, and a buffered data path is used for writing and reading data. Furthermore, the bit lines are multi-divided to reduce the parasitic capacitance of the bit line. For reading the divided bit line more effectively, multi-stage sense amps are used, such that a small local sense amp is used to insert into the memory array. And a time-domain sensing scheme is introduced, in order to differentiate data "1" and data "0" in a time-domain, and which does not require the conventional sense amp.

The memory cell can be formed on the surface of the wafer. And the steps in the process flow should be compatible within the current CMOS manufacturing environment with additional steps for forming carbon nanotube storage element. Additionally, field-effect aligning process is realized for aligning the carbon nanotubes on exact location of the memory cell, when forming the memory cell. And, the memory cell can be formed from various materials.

SUMMARY OF THE INVENTION

For realizing high speed carbon nanotube memory, local bit line is multi-divided into short line for reducing parasitic capacitance, which realizes fast read/write operation with fast charging/discharging time. And, a small local sense amp is realized for reading a data in a memory cell through lightly loaded local bit line, such that the local sense amp is composed of a local write circuit, a local pre amplifier and a local main amplifier, where a source line of the local pre amplifier is connected to a middle voltage VM as a reference voltage for detecting whether the local bit line is higher than that of the VM voltage which is also forced to the local bit line as a pre-charge voltage. In doing so, no waiting time is required for enabling the local pre amplifier after a word line is turned on, because the local pre amplifier discharges a local pre-amp node when reading data "1", otherwise the local pre amplifier does not discharge the local pre-amp node, when reading data "0". And a global sense amp is connected to the local sense amp through a read global bit line for reading an output of the local sense amp.

And a buffered data path is realized for writing and reading a data, wherein a forwarding write line serving as a forwarding write path is used for writing, such that the forwarding write path is selected by block select signals, which realizes to reduce driving current and RC time constant, because unselected portion of the data line is not charging or discharging when writing. Furthermore, unselected portion of the data line is used as a returning read path. Thus, the returning read path receives a read output from the memory cell through multi-stage sense amps. And the returning read path is also buffered and connected to data output node through multiple buffers. With the returning read path, access time is almost same regardless of selected memory cell location, which realizes to latch the read output at a time with enough set-up and hold time even though a latch clock is fixed.

And, configuring memory is more flexible, such that multiple memory macros can be easily configured with small segmented memory array and multi-stage sense amps, instead of big macro with the conventional sense amps. And number of sense amps can be determined by the target speed. For example, high speed application needs more segmented array with more sense amps, while high density application needs more memory cells with reduced number of sense amps, thus cell efficiency is increased.

During read operation, position of a bended carbon nanotube is not changed because attracting force is generated from the local bit line (which is pre-charged at the VM voltage) to the bended carbon nanotube node which is contacted to top electrode or bottom electrode, and which realizes fast operation without write-back operation and refresh operation. Furthermore, the position of the carbon nanotube is not changed after power is turned off, which realizes nonvolatile memory.

With light bit line architecture, the light bit line is quickly charged or discharged when reading and writing, such that a stored data in a memory cell is transferred to an output latch circuit through multi-stage sense amps such that high data is transferred to the output latch circuit with high gain, but low data is not transferred with low gain. By the sense amps, a voltage difference in the bit line is converted to a time difference as an output of the global sense amp with gain. In this manner, a time-domain sensing scheme is realized to differentiate high data and low data stored in the memory cell.

More specifically, a reference signal is generated by one of fast changing data with high gain from reference cells, which signal serves as a reference signal to generate a locking signal for the output latch circuit in order to reject latching another data which is slowly changed with low gain, such that high voltage data is arrived first while low voltage data is arrived later, or low voltage data is arrived first while high voltage data is arrived later depending on configuration. The time-domain sensing scheme effectively differentiates high voltage data and low voltage data with time delay control, while the conventional sensing scheme is current-domain or voltage-domain sensing scheme with a heavy bit line pair. There are many advantages to realize the time-domain sensing scheme, so that the sensing time is easily controlled by a tunable delay circuit, which compensates cell-to-cell variation and wafer-to-wafer variation, such that there is a need for adding a delay time before locking the output latch circuit with a statistical data for all the memory cells, such as mean time between fast data and slow data. Thereby the tunable delay circuit generates a delay for optimum range of locking time. And the read output from the memory cell is transferred to the output latch circuit through a returning read path, thus the access time is equal regardless of the location of the selected memory cell, which is advantageous to transfer the read output to the external pad at a time.

And, the current flow of the pass transistor of the memory cell can be reduced because the pass transistor only drives a lightly loaded local bit line, which means that the pass transistor can be miniaturized further. Moreover, the present invention realizes multi-stacked memory cell structure including thin film transistor because the memory cell only drives lightly loaded bit line even though thin film polysilicon transistor can flow lower current, for example, around 10 times lower. Thereby, bit line loading is reduced around 10 times lower for compensating the low current drivability of the pass transistor. There are almost no limits to stack multiple memory cells as long as the flatness is enough to accumulate the memory cell.

Furthermore, various alternative configurations are described for implementing the multi-stage sense amps, and an example application for content addressable memory is described. And, example memory cell layout and cross sectional views are illustrated to minimize cell area.

And the fabrication method is compatible with the conventional CMOS process for forming the memory cell. In addition, field-effect aligning process is realized for aligning the carbon nanotubes on exact location of the memory cell, when forming the memory cell. And, the memory cell can be formed from thin film polysilicon layer alternatively, because the lightly loaded bit line can be quickly discharged by the memory cell even though the thin film pass transistor can flow relatively low current. In doing so, multi-stacked memory is realized with thin film transistor, which can increase the density within the conventional CMOS process with additional process steps, because the conventional CMOS process is almost reaching to a scaling limit for fabricating transistors on a surface of a wafer. And, a body-tied TFT (Thin Film Transistor) transistor can be alternatively used as the thin film transistor for alleviating self heating problem of short channel TFT. In doing so, multi-stacked memory is realized with short channel TFT transistor.

These and other objects and advantages of the present invention will no doubt become obvious to those of ordinary skill in the art after having read the following detailed description of the preferred embodiments which are illustrated in the various drawing figures.

BRIEF DESCRIPTION OF THE DRAWINGS

The accompanying drawings which are incorporated in and form a part of this specification, illustrate embodiments of the invention and together with the description, serve to explain the principles of the invention.

FIG. 2B illustrates an I-V curve of the local pre-amp transistor when reading, FIG, 2C illustrates discharge time of the local pre-amp node, FIG. 2D illustrates timing waveform when reading data "1" and modifying data "0", FIG. 2E illustrates timing waveform when reading data "0" and modifying data "1", FIG. 2F illustrates simulated waveform when reading data "1", and FIG. 2G illustrates simulated waveform when reading data "0", according to the teachings of the present invention.

FIGS. 7E, 7F, 7G, and 7H illustrate another example layout and related circuit for the local sense amp, according to the teachings of the present invention.

FIG. 8A illustrates detailed circuit of the carbon nanotube memory cell.

FIG. 9G illustrates the cross sectional view of the carbon nanotube memory, and FIGS. 9H, 9I, 9J, 9K, 9L and 9M illustrate related structures of the carbon nanotube memory cell, according to the teachings of the present invention.

DETAILED DESCRIPTION OF PREFERRED EMBODIMENT(S)

Reference is made in detail to the preferred embodiments of the invention. While the invention is described in conjunction with the preferred embodiments, the invention is not intended to be limited by these preferred embodiments. On the contrary, the invention is intended to cover alternatives, modifications and equivalents, which may be included within the spirit and scope of the invention as defined by the appended claims. Furthermore, in the following detailed description of the invention, numerous specific details are set forth in order to provide a thorough understanding of the invention. However, as is obvious to one ordinarily skilled in the art, the invention may be practiced without these specific details. In other instances, well-known methods, procedures, components, and circuits have not been described in detail so that aspects of the invention will not be obscured.

Figure 1A:
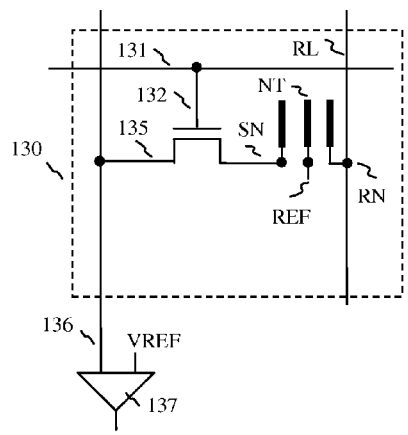
FIG. 1A illustrates a prior art of carbon nanotube memory.
Figure 1B:
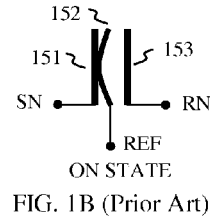
FIG. 1B illustrates "on" state of the carbon nanotube storage element as a prior art.
Figure 1C:
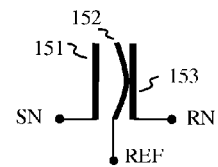
FIG. 1C illustrates "off" state of the carbon nanotube storage element as a prior art.
Figure 2A:
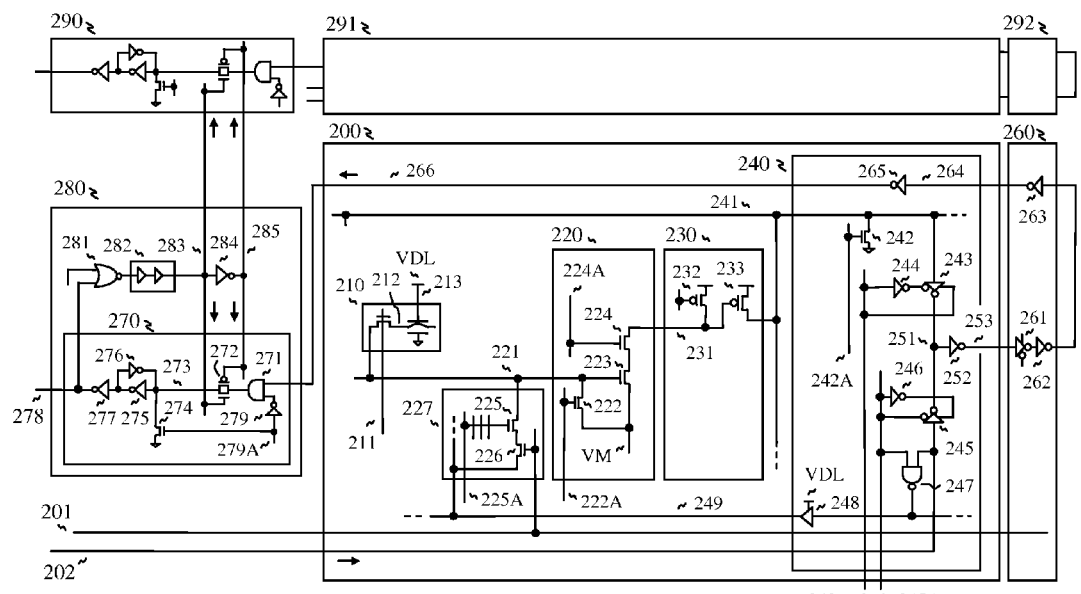
FIG. 2A illustrates high speed carbon nanotube memory.

The present invention is directed to high speed carbon nanotube memory as shown in FIG. 2A, wherein a memory block 200 comprises memory cell 210, a local sense amp including a local write circuit 227, a local pre amplifier 220 and a local main amplifier 230, and a global sense amp 240. The memory cell 210 is composed of a pass transistor and a carbon nanotube storage element. The carbon nanotube storage element is connected to the pass transistor through a storage node 212. More detailed carbon nanotube storage element is illustrated as below. And the memory cell 210 is controlled by a word line 211. Top electrode of the carbon nanotube storage element is connected to VDL voltage which is near VDD-VT voltage where VDD is a supply voltage and VT is threshold voltage of the pass transistor, and bottom electrode of the carbon nanotube storage element is connected to VSS (ground) voltage. Alternatively, the top electrode is connected to VSS voltage, and the bottom electrode is connected to VDL voltage. The memory cell 210 is connected to the local sense amp through a local bit line 221.

And the local bit line is multi-divided for reducing parasitic capacitance, such that the length of the bit line is shorter than that of conventional circuit. For instance, bit line loading is half, one-fourth or one-eighth, compared with the conventional memory. By dividing the bit line into short lines, more sense amps are required. Thus, the local sense amp is composed of 7 transistors for inserting between divided memory arrays, wherein the local sense amp includes the local pre amplifier 220, the local main amplifier 230, and the local write circuit 227, such that the local pre amplifier 220 is composed of a local pre-charge transistor 222 for pre-charging the local bit line 221 with pre-charge control signal 222A, a local pre-amp transistor 223 for detecting whether the local bit line 221 is higher than the pre-charged voltage VM (at middle voltage) or not, a local pre-amp select transistor 224 for selecting the local pre-amp transistor with a local pre-amp select signal 224A.

And the local main amplifier 230 is composed of a local pre-set transistor 232 for pre-setting a local pre-amp node 231 connecting to the local pre-amp select transistor 224, a local main-amp transistor 233 for reading the local pre-amp node 231 and driving a read global bit line 241. In particular, the local pre-amp node 231 is extremely lightly loaded because there is no long routing line, so that the local pre-amp node 231 is quickly discharged through the local pre-amp select transistor 224 and the local pre-amp transistor 223 when reading data "1", otherwise, the local pre-amp node 231 is not discharge or very slowly discharged when reading data "0". And in order to achieve fast read operation, the local main-amp transistor 233 is stronger than that of the local pre-amp transistor 223. In doing so, the local main-amp transistor 233 strongly pulls up when reading data "1".

And the local write circuit 227 is composed of a first write transistor 25 as a row write transistor with a row write control signal 225A and a second write transistor 226 as a column write transistor with a column select signal 201 for writing data input 202 through a global write bit line 249 to the memory cell.

The global sense amp 240 includes a data read circuit, a data write circuit, a bypass circuit and a data transfer circuit. More specifically, the data read circuit is composed of a global reset transistor 242 for resetting the read global bit line 241, a read tri-state inverter 243 for serving as an inverting amplifier, where the read tri-state inverter 243 is controlled by a read enable signal 243A and an inverter 244 for inverting the read enable signal 243A. The data write circuit is composed of a receive circuit, a write driver circuit and a bypass tri-state inverter 245, where a NAND gate 247 serves as a receive circuit for receiving a write data from a forwarding write line 202, and a level shifter 248 serves as the write driver circuit for driving the write global bit line 249, wherein the write driver 248 shifts the write global bit line voltage to VDL voltage which is near VDD-VT voltage, where VDD is a supply voltage and VT is threshold voltage of the pass transistor. Hence, swing voltage of the local bit line 221 is reduced from VSS (ground) voltage to VDL voltage, because the write global bit line swings from VSS voltage to VDL voltage, and the top electrode of the carbon nanotube storage element is supplied to VDL voltage as well for generating a repelling force when writing. And the bypass tri-state inverter 245 is controlled by a block select signal 245A and an inverter 246 for inverting the read enable signal 245A.

And for transferring read output, the data transfer circuit including a read inverter 252 is connected to the read tri-state inverter 243 and the bypass tri-state inverter 245 through a common node 251 for transferring the read output of the global sense amp to a forwarding read line 253. Additionally, a returning buffer 265 is used for buffering a returning read line 264. And the bypass tri-state inverter 245 in a selected block 200 is disabled by block select signal 245A (high), while unselected bypass tri-state inverter 261 in unselected block 260 is enabled for bypassing the read output of the previous block. And the read tri-state inverter 243 is enabled for the selected block 200.

When reading data "1", the local bit line (LBL) 221 is quickly charged by the carbon nanotube storage element from pre-charged voltage (at middle voltage VM) toward VDL voltage, because the storage node is connected to VDL voltage through bended carbon nanotube, while the word line 211 is asserted to a pre-determined voltage. Thus, the local pre-amp transistor 223 is turned on by the local bit line 221 near VDL voltage while the local pre-charge transistor 222 and the write transistor 225 are turned off, but the local pre-amp select transistor 224 is already turned on by asserting the select signal 224A, so that the local pre-amp transistor 223 discharges the local pre-amp node 231 through the local pre-amp select transistor 224. By discharging the local pre-amp node 231, a local main-amp transistor 233 is turned on while the local pre-set transistor 232 is turned off. By turning on the local main-amp transistor 233, the read global bit line 241 is raised to VDD voltage from VSS ground voltage when the global reset transistor 242 is tuned off.

When the read global bit line 241 is raised, the common node 251 is lowered to VSS voltage when the read tri-state inverter 243 is enabled but the global reset transistor 242 is turned off by de-asserting a global reset signal 242A. Thus, the read inverter 252 receives an output from the read tri-state inverter 243. Then, the read output from the read inverter 252 is transferred to an output latch circuit 270 through the forwarding read line 253 and inverting buffers 261, 262, 263 and 265, while unselected bypass tri-state inverter 261 in the unselected memory block 260 is turned on, in order to bypass the read output from the selected memory block 200.

In contrast, when the stored data is "0", the local bit line (BL) 221 is quickly discharged from pre-charged voltage to VSS voltage. Thereby VGS (gate-to-source) voltage of the local pre-amp transistor 223 is negative because the source line 223A is connected to the VM voltage as a reference voltage, which keeps turn-off state. Thus the local sense amp 220 keeps the pre-charge state, and the global sense amp 240 keeps the reset state. Hence, the read output is not changed, which is read data "0".

When reading, the position of the carbon nanotube is not changed, which realizes non-destructive read operation, because attracting forces are generated from the local bit line (pre-charged at the VM voltage around middle voltage) to the carbon nanotube node which is contacted at VDL or VSS voltage, which does not require refresh operation. Furthermore, the position of the carbon nanotube is not changed after power is turned off, which realizes nonvolatile memory.

Particularly, in order to reduce turn-off current, the local pre-amp transistor 223 is composed of longer channel length transistor than that of the local pre-set transistor 232, and also the local main-amp transistor 233 is composed of longer channel length transistor than that of the global reset transistor 242 of the global sense amp. Alternatively, the local pre-charge transistor 222, the local pre-set transistor 232 and the global reset transistor 242 are composed of low threshold MOS transistor, such that the low threshold transistors keep the pre-charge state strongly with sub-threshold leakage current when reading data "0", because the local pre-amp node 231 and the read global bit line 241 keep pre-charge state while the local pre-amp transistor 223 is turned off.

And a buffered data path is realized such that the buffered data path is composed of the forwarding write path and a returning read path, which realizes to reduce RC time constant and driving current, because data line is divided into short line while unselected portion of the data line is not discharging when writing. Furthermore, unselected portion of the data line is used as a read data line which is the forwarding read line 253. Thus, the forwarding read line 253 receives the read output from a memory cell through multi-stage sense amps. And the forwarding read line is buffered and connected to the output latch circuit 270 through the returning read line 264 and the returning buffer 265. With the returning read path, access time is almost same regardless of selected memory cell location, which realizes to latch the read output at a time with enough set-up and hold time even though a latch clock is fixed.

When writing, the forwarding write line 202 serves as a write path, such that the receive circuit including the NAND gate 247 is enabled by the block select signal 245A (high) for receiving a data input from the forwarding write line 202. In doing so, the write global bit line 249 is buffered to transfer the data input to the memory cell by the receive circuit 247 and also the write global bit line 249 is inverted for generating repelling force toward electrode in the carbon nanotube memory cell. During standby, the forwarding write line 202 keeps low for resetting the common node 251 to VDD voltage while the bypass tri-state inverter 245 is turned on, and all pre-charge signals and select signals are returned to pre-charge state. More detailed read operation and write operation will be explained as below.

The local pre-amp transistor 223 is stronger than the memory cell, and the local main-amp transistor 233 is much stronger than the local pre-amp transistor 223. Furthermore, the sense amp need not reference bit line because the sense amp does not compare voltage or current with reference bit line, but the sense amp detects whether the local pre-amp transistor 223 is turned on or not by the selected memory cell through the local bit line. Or the sense amp detects whether the local pre-amp transistor 223 is strongly or weakly turned on by the selected memory cell. Additionally, the local pre-amp transistor 223 and the local main-amp transistor 233 can be composed of a low threshold MOS transistor, which achieves fast read operation for high speed applications, even though turn-off current is increased. And the global sense amp 240 transfers the read output to the output latch circuit 270 through the read path. After then, the output latch circuit determines the read output whether the transferred data is "1" or "0" with a reference signal which is generated by data "1" because data "1" is reached to the output latch circuit early while data "0" is reached later. In this manner, the configuration of the memory block is simpler than the conventional sense amplifier using differential amplifier, while the conventional sense amplifier needs wide and long channel transistors for matching input transistors and load transistors in order to compensate device mismatch and process variation.

In the output latch circuit 270, the read output (data "1") changes the latch node 273 and output 278 to high from low through an AND gate 271 because the latch node 273 is pre-charged to low by NMOS 274 and the AND gate 271 with an inverter 279 which is controlled by latch control signal 279A. After then, the read output is stored in the latch node 273 with cross coupled inverters 275 and 276. And the output 278 changes NOR gate 281 to high, so that the transmission gate 272 is locked by signal 283 and 285 which are transferred from the output 278 through a tunable delay circuit 282 and inverter 284. Simultaneously, main data latch circuits 290 is also locked by the signal 283 and 285, where output latch circuit 290 is composed of same circuits as the output latch circuit 270. In doing so, the output 278 serves as a reference signal, which is generated by the reference memory cells, such as the memory cell 210 which stores high voltage data in the storage node. Adding delay circuit 282, the reference signal serves as a locking signal, where the delay circuit is tunable for differentiating high voltage data and low voltage data, more effectively, because high voltage data is arrived earlier while low voltage data is arrived later or not arrived. Thus, one of two data is arrived earlier than the other data because of inversion state of the local pre-amp transistor 223, so that one data is referred to as fast data and the other data is referred to as slow data.

Thus, the output latch circuit 270 and the delay circuit 282 configure a latch control circuit 280, in order to generate the locking signal. More detailed delay circuit will be explained as below (in FIG. 5A). And the NOR gate 281 is used to generate the reference signal even though one of reference cells is failed, where more than one reference column is added for configuring the memory block even though the drawing illustrates only one reference memory column 200 including the output latch circuit 270. In this manner, fast data from the main memory block 291 and 292 are stored to the output latch circuit 290 before the locking signals 283 and 285 lock the latch, while slow data are not latched. Furthermore, the read access time is faster than that of the conventional memory, such that multi-divided bit line architecture is introduced in order to reduce the parasitic capacitance of local bit line. As a result, the sensing scheme including the locking signal is referred to as a "time-domain sensing scheme" with the multi-stage sense amps and the locking signal.

And during write operation, the local write circuit including the write transistors 225 and 226 in the local sense amp are turned on by asserting a column select signal 201 and a write control signal 225A for overwriting data input through the receive circuit 247 and the write driver 248, such that the write global bit line 249 drives the local bit line 221 for generating attracting/repelling force, while the local pre-charge transistor 222 and the local pre-amp select transistor 224 keeps turn-off state. For writing data "1", the write global bit line is forced to VSS voltage, but the write global bit line is forced to VDL voltage for writing data "0".

Referring now to FIG. 2B in view of FIG. 2A, I-V curve of the local pre-amp transistor 223 is illustrated in logarithmic scale when reading. When the memory cell 210 stores data "1", the local bit line 221 is raised from the VM voltage to VDL voltage while the local pre-charge transistor 222 is turned off by de-asserting a pre-charge signal 222A to low, and the word line 211 is asserted to a predetermined voltage. Thereby the local pre-amp transistor 223 is turned on with strong inversion, which flows ID1 current. More accurately, the local pre-amp transistor 223 detects whether the local bit line 221 is higher than threshold voltage from the VM voltage or not. Hence, the local pre-amp transistor 223 quickly discharges the pre-amp node 231 through the local pre-amp select transistor 224 because the pre-amp node 224 is extremely lightly loaded without long routing line. As a result, the pre-amp transistor 223 converts voltage difference in the local bit line to discharging time difference.

On the contrary, when the memory cell 210 stores data "0", the local bit line 221 keeps pre-charge voltage VM as shown VSS voltage. Thereby gate-source voltage is negative, which flows only low current ID0 through the local pre-amp transistor 223 and discharges the local pre-amp node 225 very slowly. Thus the discharging time difference between data "1" and data "0" is transferred to the global sense amp. For example, data "1" is transferred to the global sense amp in million times earlier than data "0". Hence, data "1" can be used as a reference signal for rejecting to be read data "0".

Referring now to FIG. 2C in view of FIG. 2A, discharge time of the pre-amp node 231 is illustrated. When reading data "1", the pre-amp node 231 is quickly discharged by the local pre-amp transistor 223 as shown D1. On the contrary, the pre-amp node 231 is discharged very slowly by leakage current as shown D0, when reading data "0".

Referring now to FIG. 2D in view of FIG. 2A, detailed timing diagram for reading data "1" and modifying data "0" is illustrated. To read data, the pre-charge (PC) signal 222A is asserted to low, and the word line 211 is raised to a predetermined voltage. Hence the local bit line (BL) 221 is charged near VDL voltage from the VM voltage by the memory cell 210, which discharges the local pre-amp node 231 when the local pre-amp select signal (SE) 224A is asserted to high. By discharging the local pre-amp node 231, the read global bit line (GBL) 241 is raised to VDD voltage by the local mainamp transistor 233. When the read global bit line 241 is raised, the common node 251 is lowered to VSS voltage by the read tri-state inverter 243. And By lowering the common node 251, the read inverter 252 transfers the change to output node (DO) 278 through the returning read line 264 and inverting buffers 261, 262, 263 and 265. After reading data, the column select signal 201 and the write control signal 225A are asserted to high for modifying data, but the local pre-amp select signal 224A is de-asserted, which realizes read-modify-write operation as an example. Hence, the local bit line is forced to VDL voltage by the write driver circuit 248 for generating repelling force, so that the carbon nanotube is repelled by the top electrode connecting to VDL voltage, and attracted to VSS electrode. As a result, the carbon nanotube is contacted to VSS electrode. After writing (modifying) data "0", all the control signals including the pre-charge (PC) signal 222A, the word line, and other control signals, are returned to precharge state or standby mode. Alternatively, write operation can be separately executed or read operation can be separately executed (not shown), for achieving fast cycle operation. And after reading, the global reset transistor 242 is turned on for resetting the read global bit line 241. The local pre-set transistor 232 is turned on but the local pre-amp transistor 224 is turned off, when resetting.

Referring now to FIG. 2E in view of FIG. 2A, detailed timing diagram for reading data "0" and modifying data "1" is illustrated. To read data, the pre-charge (PC) signal 222A is asserted to low, and the word line 211 is raised to a predetermined voltage. Hence the local bit line (BL) 221 is discharged near VSS voltage from the VM voltage by the memory cell 210, which does not discharge the local pre-amp node 231 because the local bit line voltage is lower than the source voltage of the local pre-amp transistor 223. Thereby, the local main-amp transistor 233 keeps turn-off state, and the read global bit line 241 keeps reset state. Thus the output (DO) 278 keeps low. However, the local pre-amp node (PM) 231 may be very slowly discharged by the turn-off current through the local pre-amp transistor, which may change the local main amp transistor and the read global bit line. The turn-off current depends on transistor parameters, temperature and substrate voltage for the NMOS transistors. For reducing the turn-off current of the local pre-amp transistor, relatively long channel transistor can be used. Additionally, in order to avoid the false flip with the turn-off current, the locking signal is generated, which rejects data "0" to be latched to the output latch circuit after optimum delay time TD. After reading data "0", the write control signal 225A is asserted to high for writing data "1" while the local pre-amp select signal 224A keeps low. By asserting the write control signal 225A, the local bit line is forced to VSS voltage for generating repelling force, so that the carbon nanotube is repelled by VSS electrode, and attracted to VDL electrode. As a result, the carbon nanotube is contacted to VDL electrode. After writing (modifying) data "1", all the control signals including the pre-charge (PC) signal 222A, the word line, and other control signals, are returned to pre-charge state or standby mode.

In this manner, the time-domain sensing scheme can differentiate high voltage data and low voltage data within a predetermined time domain. Thereby, data "1" is quickly reached to the data latch circuit, which generates a locking signal, but data "0" is very slowly transferred, thus the locking signal effectively rejects data "0" to be latched to the output latch circuit. In other words, fast cycle memory (with no page mode) does not require the locking signal which is generated by the reference signal based on reference cells storing data "1", because data "0" is not reached to the output latch circuit within a short cycle. Thus, the latch control circuit receives a latch control signal from an external control circuit and generates the locking signal to lock the output latch circuit, which does not require reference cells and related circuits. And by applying multi-divided bit line architecture, fast read operation and write operation are realized. And there are various modifications and alternatives for configuring the multi-stage sense amps, in order to read data from the memory cell through the multi-divided bit line.

In FIG. 2F, simulated waveform with SPICE simulator when reading data "1" is illustrated, wherein the local pre-charge signal (PT) 222A is de-asserted for releasing the local bit line (LBL) 221, and the word line (WL) 211 is asserted for selecting the memory cell. Thus, the local bit line 221 is charged to VDL voltage from the VM voltage because the storage node (SN) 212 of the carbon nanotube is bended to VDL voltage. By charging the local bit line 221, the local pre-amp node (PM) 231 is discharged to the VM voltage through the local pre-amp transistor 223 which is turned on the local main-amp transistor 233 while the local pre-set transistor 232 is turned off. By turning on the local main-amp transistor 233, the read global bit line 241 is raised to VDD voltage, so that the common node (CM) 251 is lowered. Hence, the change is transferred to the data output (DO) 278 through buffers.

In FIG. 2G, simulated waveform when reading data "0" is illustrated, wherein the local pre-charge signal (PT) 222A is de-asserted for releasing the local bit line (LBL) 221, and the word line (WL) 211 is asserted for selecting the memory cell. Thus, the local bit line 221 is discharged to VSS voltage from the VM voltage because the storage node (SN) 212 of the carbon nanotube is bended to VSS voltage. By discharging the local bit line 221, the local pre-amp node (PM) 231 is not discharged, because the local pre-amp transistor 223 keeps turn-off state. Hence, the read global bit line 241 keeps reset state, the common node 251 keeps pre-set state, and the data output (DO) 278 keeps low.

Figure 3A:
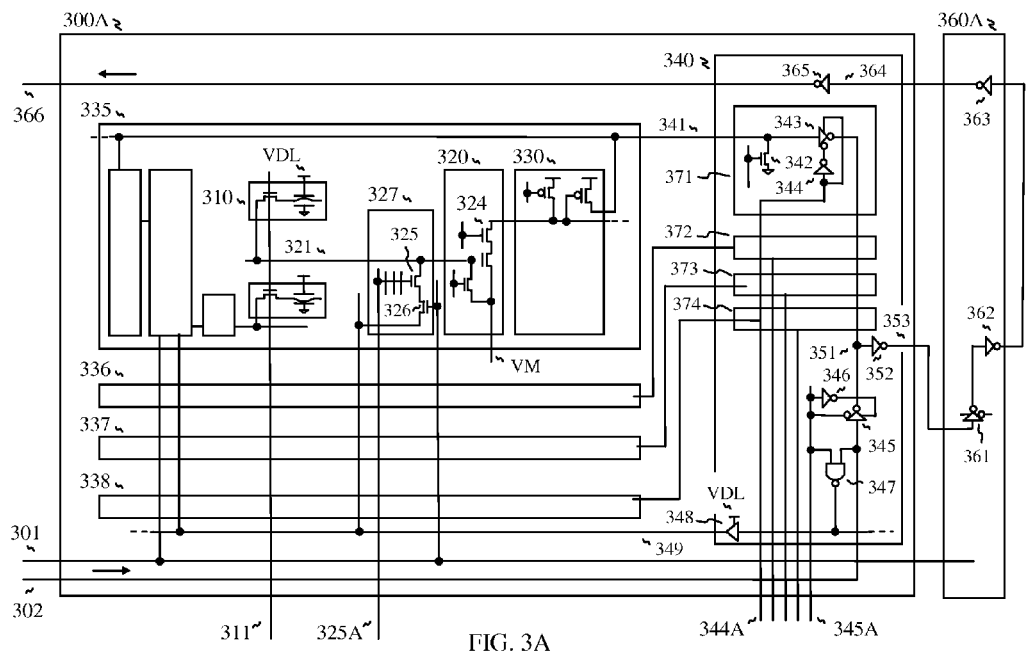
FIG. 3A illustrates a decoding scheme for the carbon nanotube memory.

In FIG. 3A, a decoding scheme for the high speed carbon nanotube memory is illustrated, wherein a memory block 300A comprises four memory segments 335, 336, 337 and 338, and one global sense amp 340. The memory segment 335 includes local sense amps and multiple memory cells. The local sense amp includes the local write circuit 327, the local pre amplifier 320 and the local main amplifier 330. The memory cell 310 is connected to the local sense amp in the right through the local bit line 321, and the other memory cell is connected to the local sense amp in the left. The memory cells are controlled by a word line 311, and top electrode is connected to VDL voltage while bottom electrode is connected to VSS voltage. The local sense amps are connected to the global sense amp 340 through the read global bit line 341, such that the global sense amp 340 includes multiple data transfer circuits and one data receive circuit. The data read circuits 371, 372, 373 and 374 are connected to the memory segments 335, 336, 337, and 338, respectively, for reading the local sense amps, wherein the data read circuit 371 is composed of the global reset transistor 342 and the read tri-state inverter 343 which is selected by a read select signal 344A and an inverted output of inverter 344 receiving the read select signal 344A. And the data write circuit is composed of the receive gate 347, the write drive circuit 348. The bypass circuit 345 receiving the block select signal 345A and an inverted block select signal of an inverter 346. And the data transfer circuit 352 is connected to the read tri-state inverter 343 and the bypass tri-state inverter 345 for transferring the read output from the read tri-state inverter 343 or the output from the bypass tri-state inverter 345 through the returning buffer 365 connecting to the returning read line 364 and buffers 361, 362 and 363.

When reading, eight memory cells are activated by the word line 311, and eight local sense amps are connected to eight memory cells, respectively. For example, the local sense amp reads the memory cell 310, and the read output from the memory cell is transferred to the data read circuit 371 through the read global bit line 341, when the local pre-amp transistor 324 is turned on but the global reset transistor 342 is turned off. In contrast, the local sense amp in the left is not selected. And other memory segments 336, 337 and 338 are not selected either, because data transfer circuits 372, 373 and 374 are de-activated. Hence, one of eight memory cells is selected. As a result, the read output is transferred to the common node 351 by the read tri-state inverter 343. And the read output is transferred to data output node 366 through inverting buffers 352, 361, 362, 363 and 365, while the bypass tri-state inverter 345 in the selected memory block is turned off by block select signals 350A (high) and 350B (low) but unselected tri-state inverter 361 in memory block 360A is turned on.

When writing, eight memory cells are also turned on, but only one memory cell 310 is overwritten by the write driver 348 through the write global bit line 349, because the row write transistor 325 is turned by asserting one of row select signal 325A to high, while the column write transistor 326 is turned on by asserting the column select 301 to high. Thus, the write data 302 is transferred to the selected memory cell through the NAND gate 347 serving as the data receive circuit. However, the left local sense amp is not activated, and other local sense amps in the memory segments 336, 337 and 338 are not activated either, because one of row select signal 325A only selects the local write circuit 327.

Figure 3B:
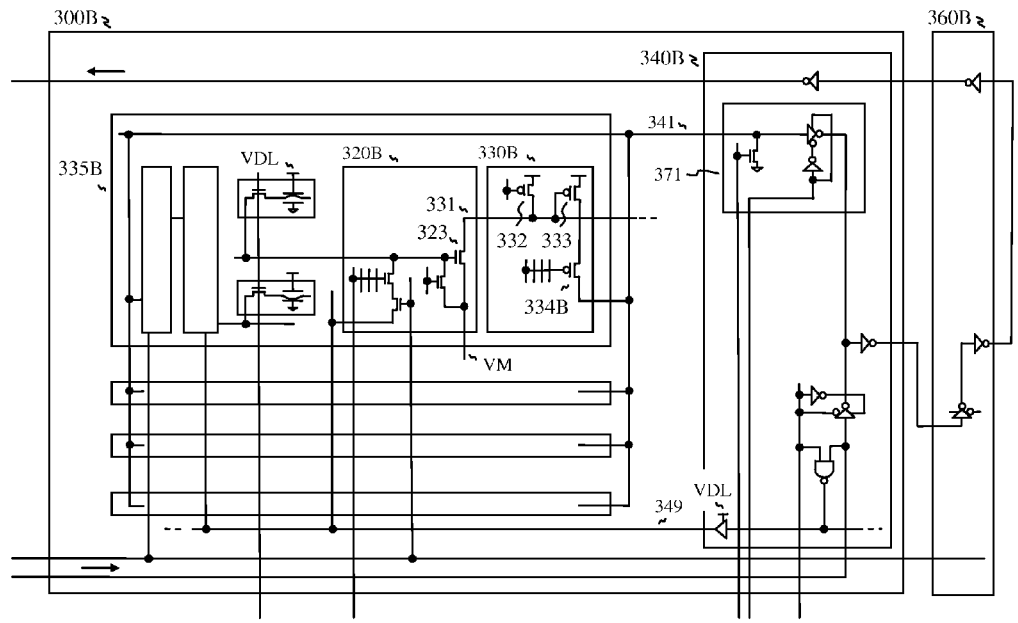
FIG. 3B illustrates alternative configuration.

In FIG. 3B, alternative configuration for the carbon nanotube memory is illustrated, wherein the local sense 320B in the memory segment 335B is modified, such that the local pre-amp transistor 323 is directly connected to the local main amp transistor 333 through the local pre-map node 331, and the local pre-set transistor 323 is connected to the local pre-amp node 331 for pre-setting. In particular, a local select transistor 343B is added for decoding the local sense amp. Thereby, one of four memory segments of the selected memory block 300B is selected, so that the read output from one of eight memory cells is transferred to the data transfer circuit 371 of the global sense amp 340B through the read global bit line 341, and transferred to data output node through unselected memory block 300B. And the write global bit line 349 is connected to one of eight memory cells as explained in FIG. 3A.

Figure 3C:
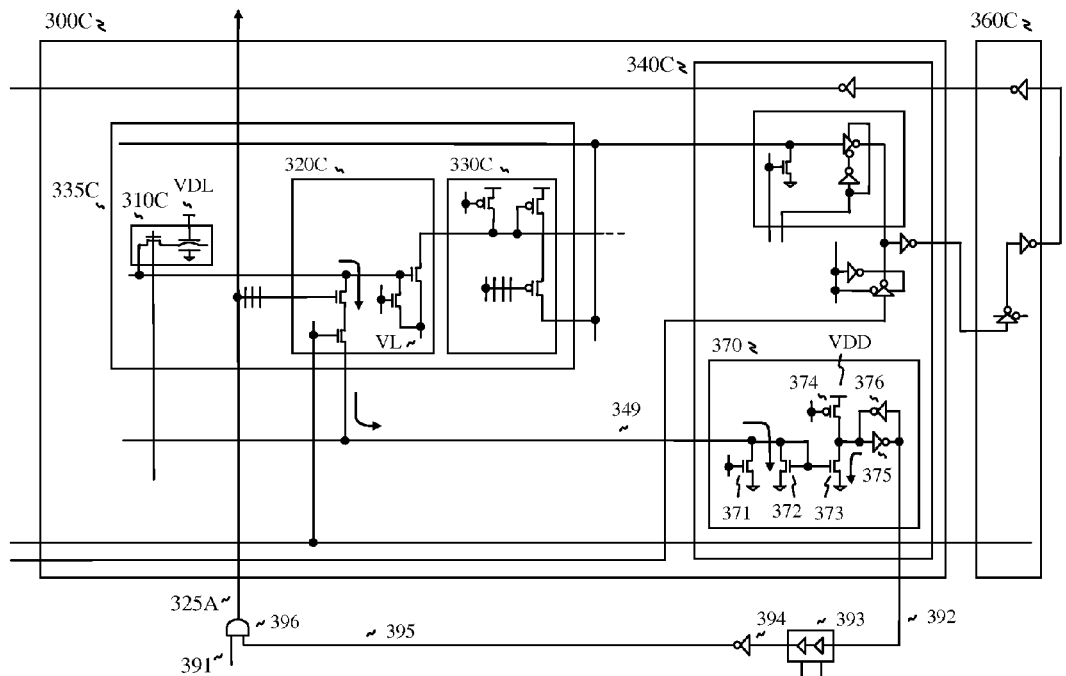
FIG. 3C illustrates alternative configuration for generating a write control signal.

In FIG. 3C, alternative configuration for generating a write control signal is illustrated, wherein the memory block 300C includes a memory segment 335C and a global sense amp 340C. Configuration of the memory segment 335C is the same as 335B in FIG. 3B, but the global sense amp 340C is modified for generating the write control signal such that a current detector circuit 370 is added, while the data transfer circuit and the data receive circuit are still same as FIG. 3B. The role of the current detector circuit 370 is to generate the write control signal 395. When writing, the memory cell 310C stores always data "1", which charges the write global bit line 349 from the pre-charge VSS voltage to VDL electrode of the memory cell 310C as a reference memory cell storing data "1". When the write global bit line 349 is raised to threshold voltage, a pull-down transistor 372 is turned on, while a reset transistor 371 is turned off. Thereby a current repeat transistor 373 repeats the current through the pull-down transistor 372, which changes a pre-set node connecting to the current repeat transistor 373 while a pre-set transistor 374 is turned off. And then inverter latch 375 and 376 receives the change. As a result, the write control signal 395 is changed from high to low through inverting buffer 394 and a tunable delay circuit 393 for delaying the output 392 of the current detector circuit 370. By lowering the write control signal 395, the first write transistor of the local write circuit is turned off, which reduces the write current after establishing current paths through the carbon nanotubes. Hence the write path is disconnected from the VDL electrode to VSS node through the bended carbon nanotube. And the write control signal 395 is connected to an AND gate 396 for disabling the row write control signal 325A, when global write enable signal 391 is asserted to high.

Figure 3D:
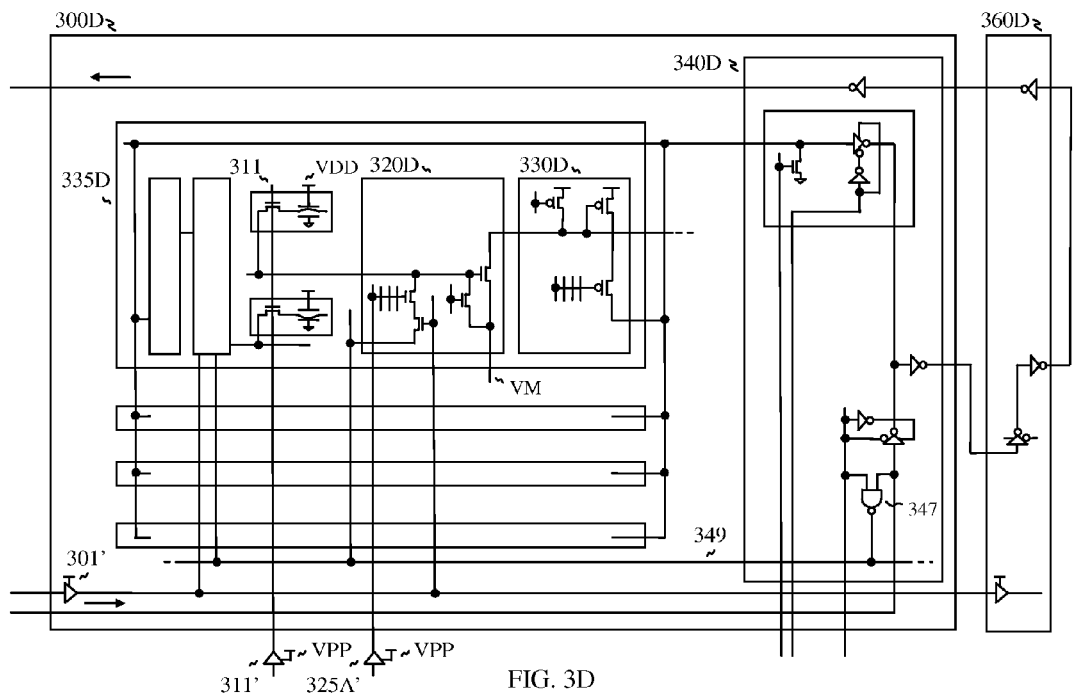
FIG. 3D illustrates alternative configuration using a booted word line voltage, according to the teachings of the present invention.

In FIG. 3D, alternative configuration is illustrated, wherein the word line 311 is driven by a level shifter 311' for raising the word line to VPP voltage, which avoids threshold voltage drop of the pass transistor. And VPP voltage is higher than VDD+VT voltage. Furthermore, level shifters 301' and 325A' are used for raising the write control signals to VPP voltage during write operation, where the write global bit line 349 is directly driven by the receive circuit 347 in the global sense amp 340D for transferring data to the memory cell. And the block configuration is the same as FIG. 3A, such that the memory segment 335D includes memory cells and the local sense amp 320D, the global sense amp 340D is connected to the memory segment 335D, and the memory block 300D is connected to another memory block 360D.

Figure 4A:
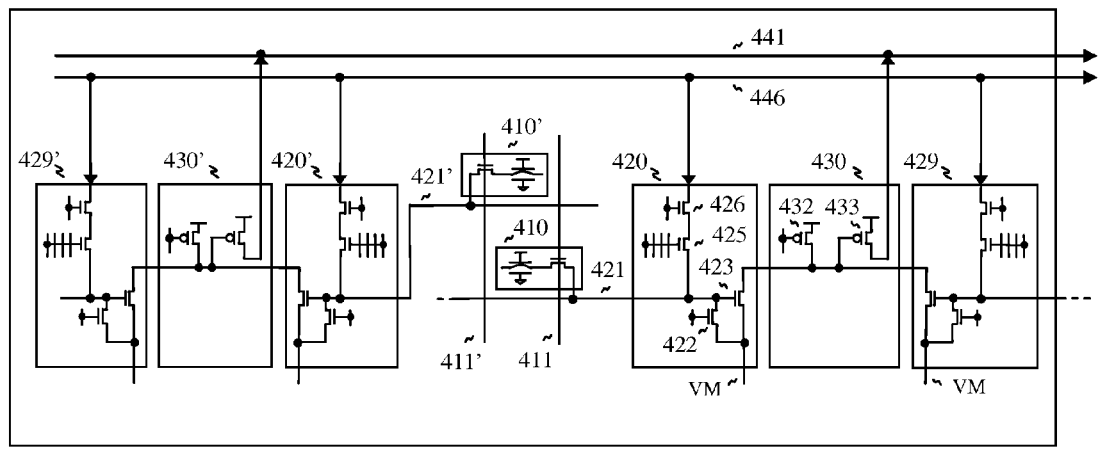
FIG. 4A illustrates alternative configuration with folded bit line.

In FIG. 4A, alternative memory block configuration with folded bit line is illustrated, wherein the word line 411 is connected to the memory cell 410 through right local bit line 421, another word line 411' is connected to another memory cell 410' through left local bit line 421', and each word line is bypassed the other memory cell. Hence, memory cell area is increased in the folded bit line cell array, but coupling noise is slightly reduced, because one of two local bit lines is not activated when reading or writing. And also power consumption is reduced because half of the bit lines and local sense amps are not activated. When the memory cell 410 is selected, the local pre amp 420 is activated, so that the read global bit line 441 is shared by right hand side local main amp 430 and left hand side local main amp 430' while the left local main amp 430' is not activated. In particular, the local main amps 430 and 430' are also shared with adjacent local pre amps, such that the right local main amp 430 is shared by the local pre amps 420 and 429, and the left local main amp 430' is shared by the local pre amps 420' and 429'. The write global bit line 446 is shared as well. And the local pre amp 420 is composed of a local pre-charge transistor 422, a local pre-amp transistor 423, write transistors 425 and 426, such that the local pre-amp transistor 423 is directly connected to the read global bit line 441. Since the read global bit line 441 and the write global bit line 446 are not shared, there is no conflict during write operation.

Figure 4B:
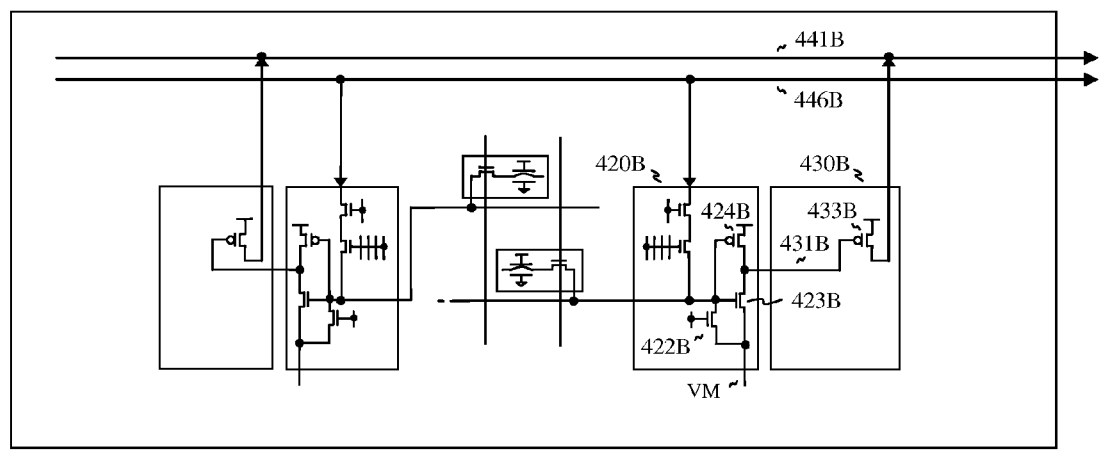
FIG. 4B illustrates alternative configuration with inverter as a local pre amplifier.

In FIG. 4B, alternative configuration with inverter as a local pre amplifier is illustrated, wherein the local pre amplifier 420B is composed of inverter including a pull-down transistor 423B and a pull-up transistor 424B, a local pre-charge transistor 422B, and write transistors. The pull-down transistor 423B is connected to the VM voltage for adjusting trip point of the inverter, so that the inverter detects whether the local bit line is higher than the VM voltage where strength of the pull-up transistor is weaker than that of the pull-down transistor. And the local main amp 430B is composed of a local main-amp transistor 433B which is connected to an output of the inverter. The read global bit line 441B is connected to the local main amp 430B. And the write global bit line 446B is connected to the write transistor of the local pre amplifier.

Figure 4C:
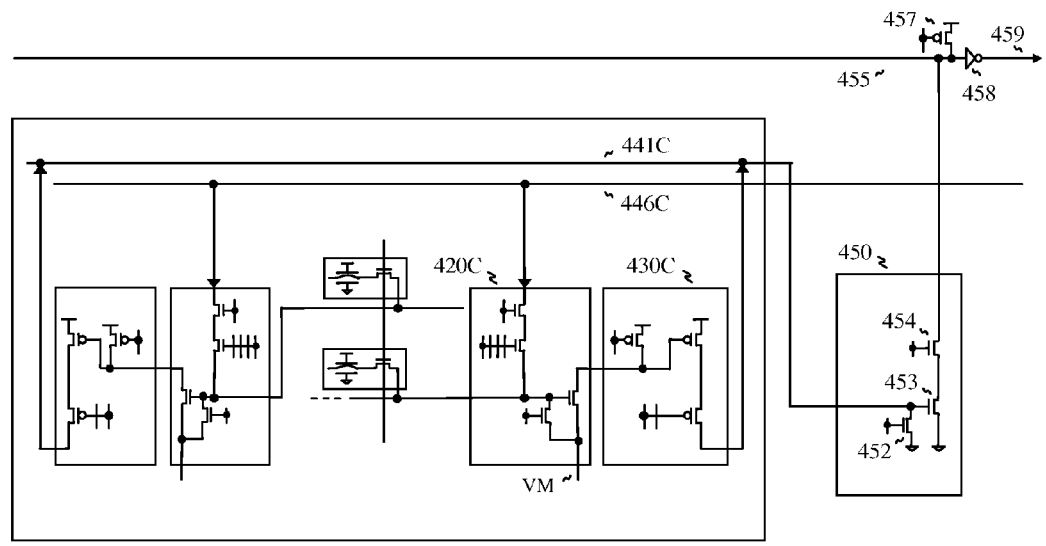
FIG. 4C illustrates alternative configuration with additional segment sense amp.

In FIG. 4C, alternative configuration with additional segment sense amp is illustrated, wherein the segment sense amp 450 is added for transferring the read output to a long destination as the global sense amp (not shown). Advantage is that a segment bit line 441C is relatively lightly loaded, so that the local sense amp quickly transfers the read output to the segment sense amp, and the strong segment sense amp quickly transfers the read output to the global sense amp, because the segment sense amp is composed of strong NMOS transistors including a segment reset transistor 452, a segment amp transistor 453 and a segment select transistor 454. More specifically, the local pre amp 420C is composed of NMOS transistors but its driving strength is weak with reduced input voltage. Thereby, the local pre amp drives extremely lightly loaded internal line only, the local main amp 430C is composed of PMOS transistors for driving relatively lightly loaded the segment bit line, and the segment sense amp 450 is composed of NMOS transistors for driving heavy global bit line 455. Then, an inverter 548 is used to recover the phase, and a global pre-charge transistor 457 is used for pre-charging. And inverter output 459 is connected to the read tri-state inverter of the global sense amp (tri-state inverter 243 as shown in FIG. 2A). And the write global bit line 446C is connected to the write transistor of the local pre amp. Other block to block operation is same as FIG. 2A.

Figure 4D:
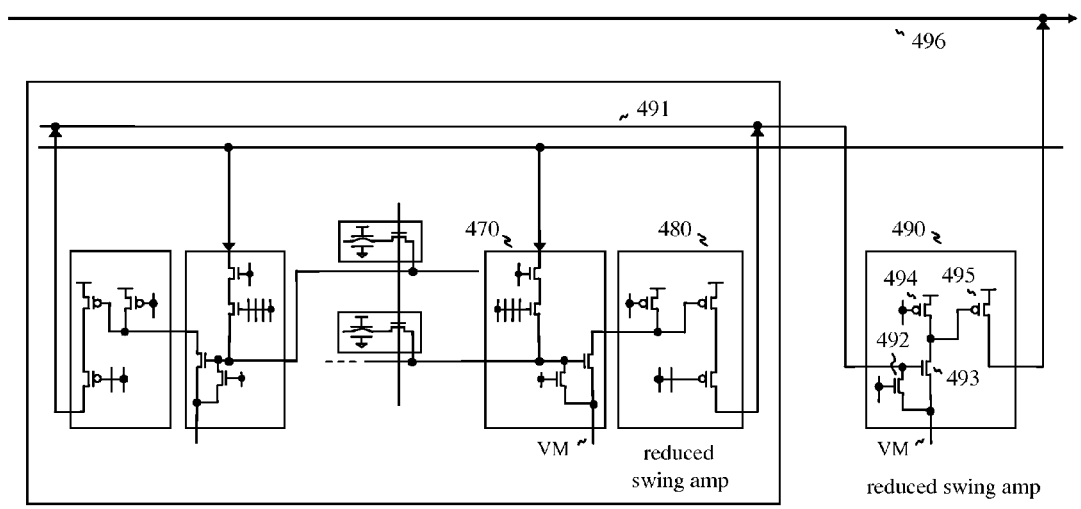
FIG. 4D illustrates alternative configuration with reduced swing amplifiers, according to the teachings of the present invention.

In FIG. 4D, alternative configuration with reduced swing amplifier is illustrated, wherein swing voltage of the local sense amp and the segment sense amp are reduced. With reduced swing voltage, low power consumption is realized, because charging and discharging current are reduced when operating. In configuration, the local sense amp includes the local pre amp 470 and the local main amp 480, where the configuration of the local sense amp is the same as FIG. 3B. And the segment sense amp 490 is composed of a pre-charge transistor 492, a segment pre-amp transistor 493, a pre-set transistor 494, and a segment main-amp transistor 495 which is connected to the global bit line 496. The segment bit line is pre-charged to the VM voltage during standby, and then the segment bit line is raised to VDD voltage when reading data "1". Otherwise, the segment bit line is not changed. And other operation is same as above.

Figure 5A:
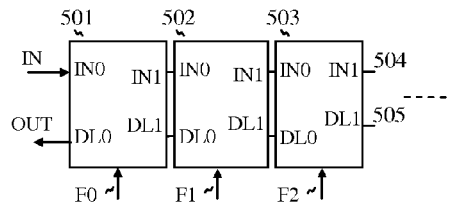
FIG. 5A illustrates a tunable delay circuit.

In FIG. 5A, more detailed a tunable delay circuit (as shown 282 in FIG. 2A) is illustrated, wherein multiple delay units 501, 502 and 503 are connected in series, the first delay unit 501 receives input IN and generates output OUT, the second delay unit 502 is connected to the first delay unit, and the third delay unit 503 is connected to the second delay unit 502 and generates outputs 504 and 505, and so on. Each delay unit receives a fuse signal, such that the first delay unit receives F0, the second delay unit receives F1, and the third delay unit receives F2. And more detailed delay unit is illustrated in FIG. 5B, wherein the delay unit 510 receives an input IN0 and a fuse signal Fi, thus the fuse signal Fi selects output from the input IN0 or input DL1, so that a transfer gate 511 is turned on when the fuse signal Fi is low and output of inverter 513 is high, otherwise another transfer gate 512 is turned on when the fuse signal Fi is high and output of inverter 513 is low to bypass DL1 signal. Inverter chain 514 and 515 delays IN0 signal for the next delay unit, where more inverter chains or capacitors can be added for the delay even though the drawing illustrates only two inverters.

Figure 5C:
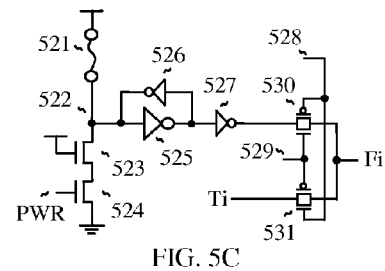
FIG. 5C illustrates a related fuse circuit of the tunable delay circuit, according to the teachings of the present invention.
Figure 5B:
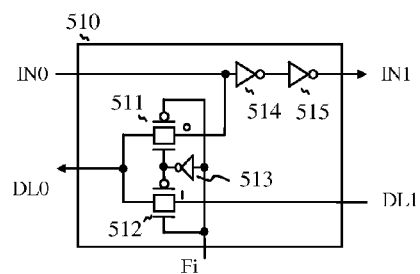
FIG. 5B illustrates a delay unit of the tunable delay circuit.

In FIG. 5C, a related fuse circuit of the tunable delay circuit (as shown in FIG. 5A) is illustrated in order to store information for the delay circuit, so that a fuse serves as a nonvolatile memory, wherein a fuse 521 is connected to a latch node 522, a cross coupled latch including two inverters 525 and 526 are connected to the latch node 522, pull-down transistors 523 and 524 are serially connected to the latch node 522 for power-up reset. Transfer gate 530 is selected by a select signal 529 (high) and another select signal 528 (low) in order to bypass the latch node voltage 522 through inverter 525 and 527. In doing so, fuse data is transferred to output node Fi, otherwise test input Ti is transferred to Fi when a transmission gate 531 is turned on.

Figure 6A:
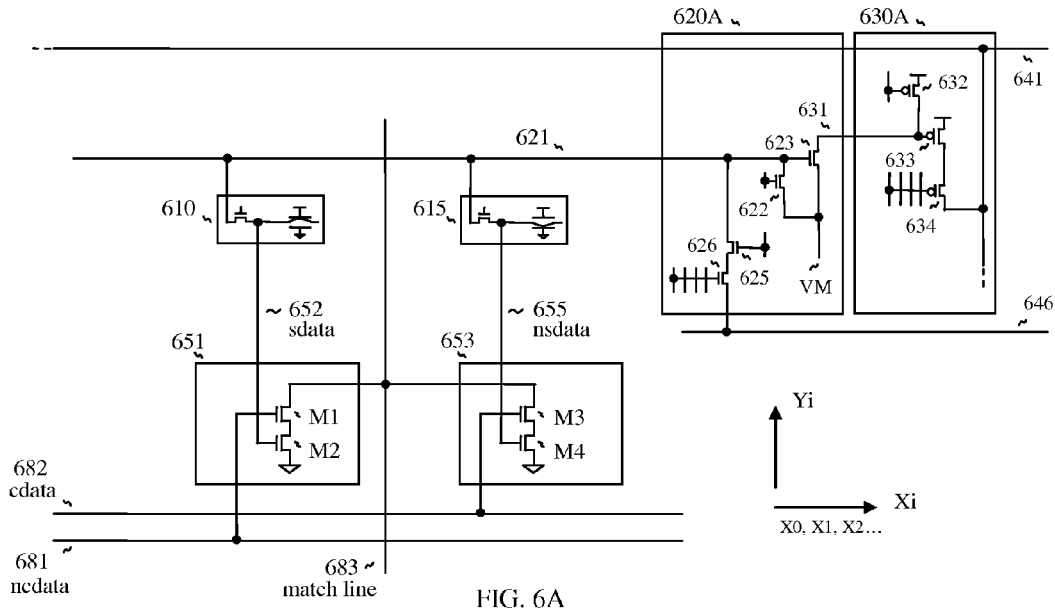
FIG. 6A illustrates an example application for configuring a content addressable memory.

Additionally, in FIG. 6A, an example embodiment to implement CAM (content addressable memory) including the memory is illustrated. There are two memory cells 610 and 615, and two compare circuits 651 and 653 in a CAM cell. Read-write operation for the memory cells is the same as single port memory as explained above. And CAM operation is added in order to compare the stored data and the incoming data referred to as comparand. In detail, a CAM is a storage device that is particularly suitable for matching functions because it can be instructed to compare a specific pattern of comparand data with data stored in an associative CAM array. A CAM can include a number of data storage locations, each of which can be accessed by a corresponding address. Functionality of a CAM depends at least in part on whether the CAM includes binary or ternary CAM cells. Ternary CAM cells are mask-per-bit CAM cells that effectively store three states of information, namely a logic "1" state, a logic "0" state, and a don't care state for compare operations. Ternary CAM cells typically include a second memory cell that stores local mask data for the each ternary CAM cell. The local mask data masks the comparison result of the comparand data with the data stored in a first memory cell such that, when the mask bit has a first predetermined value (a logic "0", for example) its compare operation will be masked so that the comparison result does not affect the match line. The ternary CAM cell offers more flexibility to the user to determine on an entry-per-entry basis which bits in a word will be masked during a compare operation. However, the conventional SRAM cell based CAM is slow and big because transistors of the memory cell is wider than minimum feature size in order to drive heavy bit line during read, as published, U.S. Pat. No. 6,480, 406. Thus the carbon nanotube memory is useful for the CAM application, which realizes high-speed and high-density CAM.

The memory cells 610 and 615 store data in the storage nodes 652 and 655, respectively. Thus, the write data are stored in the storage nodes 652 and 655. The local pre amplifier 620A is connected to the memory cells through the local bit line 621, wherein the local pre amplifier 620A is composed of the pre-charge transistor 622, the local pre-amp transistor 623 for reading, and the write transistors 625 and 626 for writing. And the local main amplifier 630A is composed of the local pre-set transistor 632 connecting to the local pre-amp transistor 623 through the local pre-amp node 631, the local main amp transistor 633 connecting to the local pre-amp node 631, and the local select transistor 634 which is connected to the read global bit line 641. Compare circuits 651 and 653 including NMOS transistors M1 and M2, M3 and M4 are connected to a match line 683 (ML) for comparing the stored data and the incoming data.

Figures 6B, 7A, 7B, 7C, 7D:
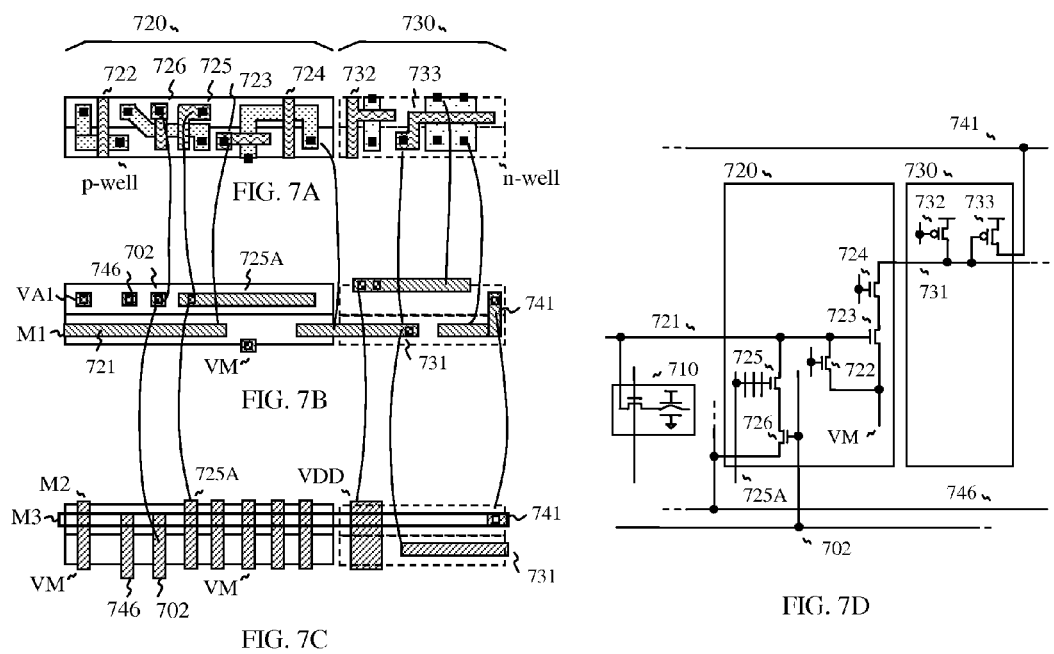
FIG. 6B illustrates a truth table summarizing the logical relationships among various signals for the content addressable memory, according to the teachings of the present invention.
FIGS. 7A, 7B, 7C and 7D illustrate an example layout and related circuit for the local sense amp.

Referring now to FIG. 6B in view of FIG. 6A, a truth table is shown summarizing the behavior of CAM cell in relation to signal states maintained by various elements within CAM cell in accordance with the present invention, wherein the compare circuits are configured by the NMOS M1 to M4. Thus, the signal polarities of the internal nodes are non-inverted for controlling the match line ML 683. First column T21 lists binary states of "0" and "1" that can be stored in storage node 655 (namely nsdata) of the memory cell (CAM) cell) 615; second column T22 lists binary states of "0" and "1" that can be stored in storage node 652 (namely sdata) of the memory cell CAM) cell) 610. Third column T23 lists the ternary states that can be maintained in one of the complement compare data lines, namely cdata which is the signal 682. Fourth column T24 lists the ternary states that can be maintained in the other complement compare data line, namely ncdata which is the signal 681. Fifth column T25 lists "low" and "high" as the two available voltage levels for match line 683. Finally, sixth column T26 lists "match" and "mismatch" as the two possible results for comparing states of ncdata line 681 and cdata line 682 with the states of CAM cell.

Row T31 indicates masked case where sdata 652 and nsdata 655 are "0" which makes match line to stay the precharge level at logic high, regardless of the compare data, such that the stored data "0" has ground potential which turns off NMOS compare circuit M2 and M4, rows T32-T33 both indicate that "0" state of CAM cell is represented by "0" of memory cell 610, and "1" of memory cell 615. In row T32, because state "1" of cdata line 682 does not match state "0" of CAM cell (sdata 652), M3 and M4 set up a current path for the match line ML so that the match line ML is driven "low" to indicate a mismatch of the data key and the stored value of CAM cell. In row T33, because state "0" of cdata line 682 matches state "0" of CAM cell (sdata 652), match line ML is driven "high" to indicate a partial match of the comparand and the stored value of CAM.

Rows T34-T35 both indicate that "1" state of CAM cell is represented by "1" of memory cell 610 and "0" of memory cell 615. In row T34, because state "1" of cdata line 682 matches state "1" of CAM cell, match line 683 ML is driven "high" to indicate a partial match of the comparand and the stored value of CAM cell. In row T35, because state "0" of cdata line 682 does not match state "1" of CAM cell, M1 and M2 set up a current path for the match line ML, so that the match line ML is driven "low" to indicate a mismatch of the comparand and the stored value of CAM cell.

Methods of Fabrication

The memory cells can be formed from single crystal silicon on a wafer. Alternatively, the memory cells can be formed from thin-film polysilicon layer within the current CMOS process environment. Furthermore, the memory cells can be formed in between the routing layers. In this manner, fabricating the memory cells is independent of fabricating the peripheral circuits on the surface of the wafer. In order to form the memory cells in between the metal routing layers, LTPS (Low Temperature Polycrystalline Silicon) can be used, as published, U.S. Pat. No. 5,395,804, U.S. Pat. No. 6,852,577 and U.S. Pat. No. 6,951,793. The LTPS has been developed for the low temperature process (around 500 centigrade) on the glass in order to apply the display panel. Now the LTPS can be also used as a thin film polysilicon transistor for the memory device on the wafer. The thin film based transistor can drive multi-divided bit line which is lightly loaded, even though thin film polysilicon transistor can flow less current than single crystal silicon based transistor on the surface of the wafer, for example, around 10 times weaker than that of conventional transistor, as published, "Poly-Si Thin-Film Transistors: An Efficient and Low-Cost Option for Digital Operation", IEEE Transactions on Electron Devices, Vol. 54, No. 11, November, 2007, and "A Novel Blocking Technology for Improving the Short-Channel Effects in Polycrystalline Silicon TFT Devices", IEEE Transactions on Electron Devices, Vol. 54, No. 12, December, 2007. During LTPS process, the MOS transistor in the control circuit and routing metal are not degraded. And the steps in the process flow should be compatible with the current CMOS manufacturing environment for forming carbon nanotube memories, such as U.S. Pat. No. 7,112,493, U.S. Pat. No. 7,017,023 and U.S. Pat. No. 6,969,651. And forming the thin film transistor is similar to forming TFT (thin film transistor) SRAM, as published, "A 256 Mb Synchronous-Burst DDR SRAM with Hierarchical Bit-Line Architecture for Mobile Applications", IEEE International Solid-State Conference, pp 476-477, 2005, and U.S. Pat. No. 6,670,642. In this respect, detailed manufacturing processes for forming the memory cell, such as width, length, thickness, temperature, forming method, or any other material related data, are not described in the present invention.

In FIG. 7A, example layout for the local sense amp including the local pre amplifier 720 and the local main amplifier 730 is illustrated, wherein the local pre amplifier 720 is placed next to memory cell (not shown) and the local main amplifier 730 is placed next to the local pre amplifier 720. The local pre amplifier 720 includes poly gate 722 as the local pre-charge transistor, poly gate 724 as a pre-amp select transistor, poly gate 725 as a (row) write transistor and poly gate 726 as a (column) write transistor for configuring the local write circuit. The local main amplifier 730 includes poly gate 732 as the local pre-set transistor 732, and poly gate 733 as the local main transistor. And NMOS transistors 722, 723, 724, 725 and 726 are formed on p-well region. And PMOS transistors 732 and 733 are formed on n-well region. And in FIG. 7B, metal-1 region and via-1 region are defined, such that metal-1 line as the local bit line 721 is connected to drain region of the local pre-charge transistor 722 and gate region of the local pre-amp transistor 723. And, metal-1 region 702 is connected to poly gate 726, and metal-1 region 725A is used to connect the poly gate 725 for selecting one of four rows (not columns). Metal-1 layer 746 is used to connect write bit line. And in FIG. 7C, metal-2 region is defined, such that the VM voltage is provided to the local pre amplifier, the write bit line 746 is connected to metal-1 region. In order to decode the write transistor 725, four column select signals are formed, and one signal 725A is connected to the write transistor 725. And the local pre-amp node 731 is formed to be shared by adjacent column because one of two local pre amplifiers is selected by the local pre-amp select transistor 724. And metal-1 line 731 serving as the local pre-amp node is shared by adjacent local pre amplifier (not shown).

In FIG. 7D, an equivalent circuit including the local pre amplifier 720 and the local main amplifier 730 is illustrated. The local pre amplifier 720 includes the write transistors 725 and 726 which are connected to write control signals 725A and 702 respectively, the local pre-charge transistor 722, the local pre-amp transistor 723 which is connected to the local pre-amp node 731, and the local pre-amp select transistor 724. The memory cell 710 is connected to the local pre amplifier 720 through the local bit line 721. The local main amplifier 730 includes the local pre-set transistor 732 and the local main amp transistor 733. And the node numbers of the equivalent circuit as shown in FIG. 7D are the same as those of FIG. 7A to 7C for ease of understanding.

In FIG. 7E, another example layout for the local sense amp including the local pre amplifier 770 and the local main amplifier 780 is illustrated, wherein the local pre amplifier 770 is placed next to memory cell (not shown) and the local main amplifier 780 is placed next to the local pre amplifier 770. The local pre amplifier 770 includes poly gate 772 as the local pre-charge transistor, poly gate 775 as a (row) write transistor, and poly gate 776 as a (column) write transistor. The local main amplifier 780 includes poly gate 782 as the local pre-set transistor 782, poly gate 783 as the local main transistor, and poly gate 784 as the local main amp select transistor. And NMOS transistors 772, 773, 775 and 776 are formed on p-well region. And PMOS transistors 782, 783 and 784 are formed on n-well region. And metal-1 region and via-1 region are defined as shown in FIG. 7F, such that metal-1 line as the local bit line 771 is connected to drain region of the local pre-charge transistor 772 and gate region of the local pre-amp transistor 773. And, metal-1 region 752 is connected to poly gate 776, and metal-1 region 775A is used to connect the poly gate 775 for selecting one of four rows (not columns). And metal-1 line 781 serving as the local pre-amp node is shared by adjacent local pre amplifier (not shown). Metal-1 layer 796 is used to connect write bit line. And in FIG. 7G, metal-2 region is defined, such that the VM voltage is provided to the local pre amplifier, the write bit line 796 is connected to metal-1 region. In order to decode the write transistor 775, four column select signals are formed, and column select signal 775A is connected to the write transistor 775.

In FIG. 7H, an equivalent circuit including the local pre amplifier 770 and the local main amplifier 780 is illustrated. The local pre amplifier 770 includes the write transistors 775 and 776 which are connected to write control signals 775A and 752 respectively, the local pre-charge transistor 772, and the local pre-amp transistor 773 which is connected to the local pre-amp node 781. The memory cell 760 is connected to the local pre amplifier 770 through the local bit line 771. The local main amplifier 780 includes the local pre-set transistor 782, the local main amp transistor 783 and the local main amp select transistor 784. And the node numbers of the equivalent circuit as shown in FIG. 7H are the same as those of FIG. 7E to 7G for ease of understanding.

In FIG. 8A, detailed schematic of the carbon nanotube memory cell is illustrated, wherein the memory cell 800 includes a pass transistor (word line) 802 and a carbon nanotube (NT) 807. For storing data, the carbon nanotube 807 is attracted to bottom electrode 806 (connected to ground) or top electrode 805 (connected to power supply). And the memory cell 800 is connected to a bit line 801.

During write operation, the carbon nanotube 807 is contacted to one of two electrodes, so that a current path is set up after contacting. Thus, total contacting current is relatively high if the memory block is big, which may cause pattern sensitivity with IR drop of supply line. For example, the memory array includes 512 bit lines, and one of eight bit lines is selected and written by one-of-eight column decoding as explained above. Hence, 64 bit lines are written at a same time. Furthermore, more current will flow if there are more memory blocks. And this current is static current which may cause IR drop from supply node and ground node. In order to reduce high static current during write operation, two current limit transistors are added for the two electrodes, such that a PMOS current limit transistor 811 is added to the top electrode 805 and an NMOS current limit transistor 813 is added for the bottom electrode 806, where the current limit transistors are always turned on, and the PMOS current limit transistor 811 is powered by the VDL or the VDD voltage. Additionally, big reservoir capacitor is added to each electrode, such that a top reservoir capacitor 812 is added to the top electrode 805, and a bottom reservoir capacitor 814 is added to the bottom electrode 806. In doing so, the reservoir capacitors serve as a big charge source, which can provide instantaneous current with the stored charges. This operation is similar to a supply from a battery for a short time. And static current is limited by the current limit transistors, which reduces static power consumption and reduces data pattern sensitivity with less IR drop. And the reservoir capacitors and the current limit transistors are drawn in a cross section of row decoder and column decoder (not shown). Hence, no additional area is required.

Figure 8B:
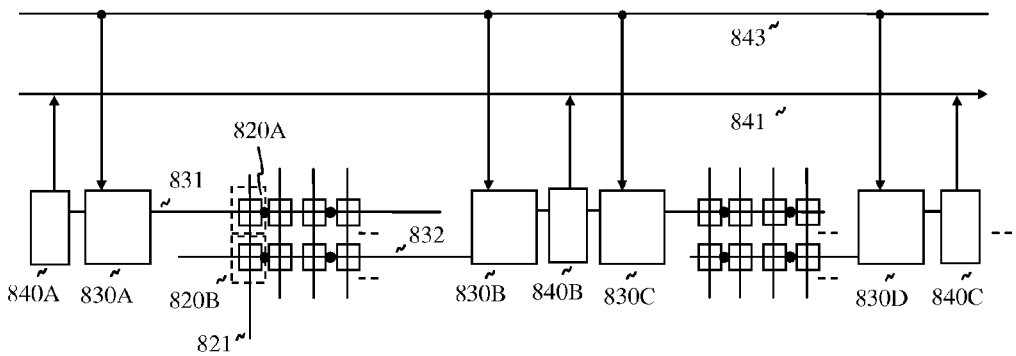
FIG. 8B illustrates block diagram for the open bit line cell array, according to the teachings of the present invention.

And detailed array configuration is illustrated in FIG. 8B, wherein a memory cell 820A is connected to left local bit line 831 which is also connected to left local pre amplifier 830A in order to read a data from the memory cell with a word line 821, and another memory cell 820B is connected to right local bit line 831 which is connected to right pre amplifier 830B. The left pre amplifier 830A is connected to left local main amplifier 840A, and the left pre amplifier 830B is connected to right local main amplifier 840B. When reading data, only one word line 821, for example, is asserted to a predetermined voltage. Thus, the read output from the memory cell 820A is transferred to the read global bit line 841 through the left local pre amplifier 830A and the left local main amplifier 840A, while the right pre amplifier 830B and the right local main amplifier 840B are not selected. And the other amps 830C, 830D and 840C are not activated. And write operation is executed by a write bit line 843 through the left local pre amplifier 830A.

Figure 9A:
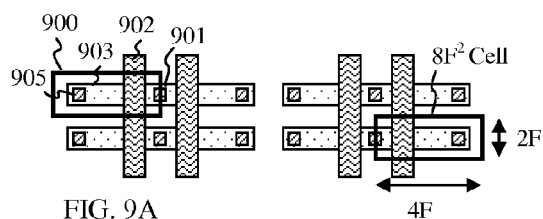
FIGS. 9A, 9B, 9C, 9D, 9E and 9F illustrate an example layout of the carbon nanotube memory.
Figure 9D:
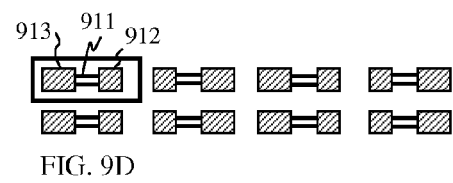
Figure 9B:
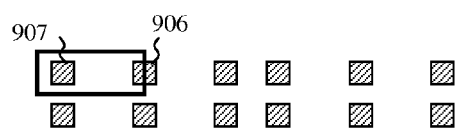
Figure 9E:
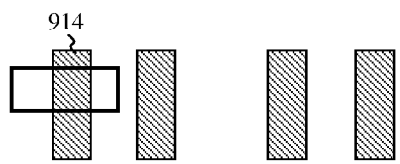
Figure 9C:
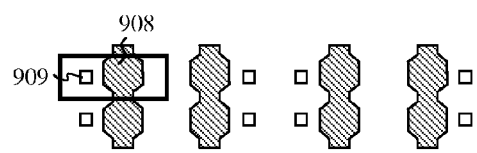
Figure 9F:
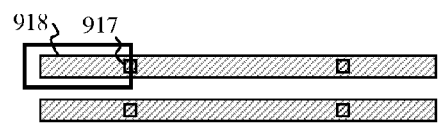

FIG. 9A to 9M illustrate an example layout for configuring the carbon nanotube memory cell array. The memory cell occupies around 8F.sup.2 in order to include the carbon nanotube storage element. In FIG. 9A, a solid line 900 depicts a memory cell, wherein active region 901 serves as drain region, another active region 903 serves as source region, and poly layer 902 serves as gate region 902. After then, contact region 905 is formed, in order to connect the active region to the carbon nanotube storage element and the local bit line. In FIG. 9B, metal-1 layer 906 and 907 are formed on the contact region. In FIG. 9C, bottom electrode 908 is formed, and then via-1 region 909 is formed for connecting the carbon nanotube. In FIG. 9D, the carbon nanotube 911 is deposited and aligned, after then supporting regions 912 and 913 are formed. In FIG. 9E, top electrode 914 is formed. And in FIG. 9F, bit line contact region 917 is formed and the local bit line 918 is formed.

More detailed structure 900 is illustrated in FIG. 9G, wherein the pass transistor is composed of drain region 901, source region 903, gate poly 902, and body 919. The gate poly 902 includes silicide region 902A which reduces sheet resistance, and the poly gate serves as a word line for the memory cell. And the source region 903 is formed in order to connect metal-1 region 907 through ohmic contact region and contact region 905. Metal-2 region is defined for forming the bottom electrode 908. Then, the carbon nanotube 911 is aligned on the bottom electrode 908, where the carbon nanotube 911 is connected to metal-3 layer 912 and 913 for pinning the carbon nanotube 911. And the top electrode 914 is formed on a gap region 915 in the insulation region 916, so that the stored data in the carbon nanotube is transferred to the local bit line 918 through the pass transistor 902, contact region 904, metal-1 region 906, and deep contact region 917.

In order to align the carbon nanotubes, there are various methods in the prior arts. For example, the carbon nanotubes can be deposited on the wafer, as published, U.S. Pat. No. 7,112,493, and electric field can be applied as published, U.S. Pat. No. 6,837,928 and U.S. Pat. No. 7,105,851. And the carbon nanotubes can be aligned within a host phase of a material that has molecules that will align under electric field. When the host molecules become aligned, they cause the carbon nanotube fibers to also become aligned in the same direction. The film of aligned carbon nanotubes is then cured into a permanent phase, as published, U.S. Pat. No. 6,312,303. However, it is still difficult to align the carbon nanotubes on the exact location of the memory cell array within the methods of the prior arts. For aligning the carbon nanotubes on the exact location of the electrode region of the memory cell while fabrication the carbon nanotube memory, in the present invention, a new method is introduced, such that the storage node and the bottom electrode are used to generate electric field for attracting the carbon nanotubes on the exact location of the memory cell.

More specifically, in FIG. 9H, for aligning the carbon nanotube 911 on the bottom electrode 908, insulation layer 908A, such as nitride layer, is deposited after forming the bottom electrode 908, the pass transistor 902 and the contact region 909, where the pass transistor is composed of gate region 902, n-type source region 903, n-type drain region 901 and p-type body region 919. And the contact region 909 is connected to the source region serving as the storage node 903 through the metal-1 region 907. P-type substrate region 919 as the body region is forced to ground voltage, which provides negative charges to the contact region 909 as the storage node, because the storage node is discharged by reverse bias leakage current of the p-n diode. And subthreshold leakage current of the pass transistor 902 discharges the storage node while the gate 902 is floating or discharged to ground voltage because there is no positive supply source to the gate as the word line. Since the storage node 909 is extremely lightly loaded, the discharge time is very short, such as, a few micro seconds. After then, the carbon nanotubes are deposited, or grown with the conventional method. Then, positive voltage is applied to the bottom electrode 908. Since the bottom electrode 908 is not connected to other layers under metal-1 and contact region, it can be forces to relatively high voltage, as long as the insulation 980A is not broken down. By raising the bottom electrode voltage, electric field is applied between the bottom electrode 908 and the storage node 909. And electric field is also applied between the bottom electrode 908 and the drain region (bit line region) including 901 and 901A. When the electric field is strongly applied, the carbon nanotubes are aligned by the electric field. Alternatively, strong negative voltage can be applied to the bottom electrode 908 for generating negative electric field.

In FIG. 9I, top view is illustrated for aligning the carbon nanotubes, wherein shape of the bottom electrode region 908 is a convex type for generating stronger electric field near the storage node 909, because electric field is stronger between edge of the bottom electrode 908 and the storage node 909. And the electric field is repeating between the bottom electrode 908 and the drain region 901A. This means that the storage node 909 serves like a cold cathode, as published, U.S. Pat. No. 5,148,079 and U.S. Pat. No. 5,229,331, in order to generate strong electric field. Hence, the carbon nanotubes 911 are aligned on the strong electric field area between the storage node and the bottom electrode. Since the bottom electrode is not connected to any other layers, relatively high voltage can be applied to the bottom electrode for aligning the carbon nanotubes.

In FIG. 9J, supporting layer 912 and 913 are illustrated for pinning the carbon nanotube 911, and top electrode 914 is depicted. And in FIG. 9K, the structure of the carbon nanotube is illustrated, wherein a gap region 915 is formed under the top electrode 914. And detail forming procedure will depicted as below.

Figure 9L:
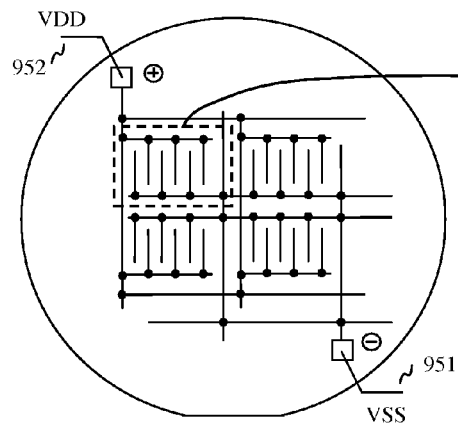
Figure 9M:
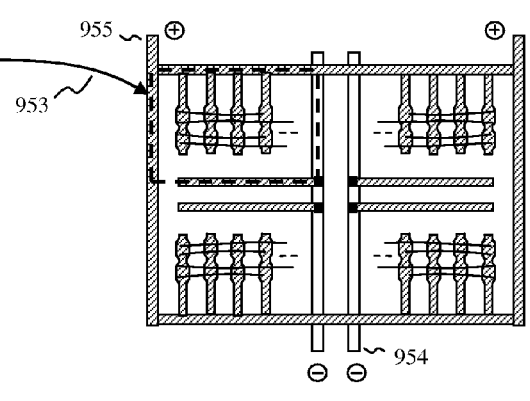

In FIG. 9L, top view of the bottom electrode is illustrated, wherein the bottom electrode is connected to VDD voltage or higher through an input node 952. All chips on the wafer are connected to metal-2 layer for supplying high voltage to the bottom electrode, because metal-2 layer is not related to other layers, such as, metal-1 layer and contact region. In contrast, wafer substrate is connected to VSS (ground) voltage through another input 951, so that the storage node is discharged to VSS voltage by reverse bias leakage current. Alternatively, metal-1 layer may be used for connecting VSS voltage to the substrate. And in FIG. 9M, more detailed metal connection is shown for supplying VDD voltage to the bottom electrode of each block and each chip on the wafer through metal-2 layer, wherein metal-2 layer 955 is illustrated for supplying VDD voltage to each block 953. And the metal-2 layer 955 serves as the bottom electrode which is convex type, but metal-1 layer 954 is partly shown because the substrate provides VSS voltage to the storage node.

Figure 10A:
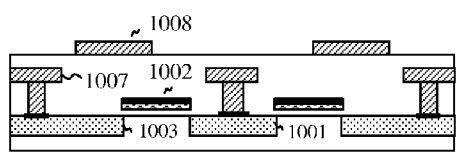
FIGS. 10A, 10B, 10C, 10D, 10E, 10F, 10G, 10H, 10I, 10J, 10K, 10L and 10M illustrate a procedure to form the memory cell as an example, according to the teachings of the present invention.
Figure 10B:
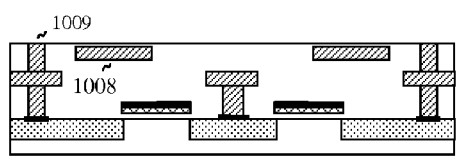
Figure 10C:
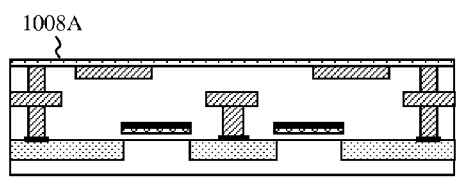
Figure 10D:
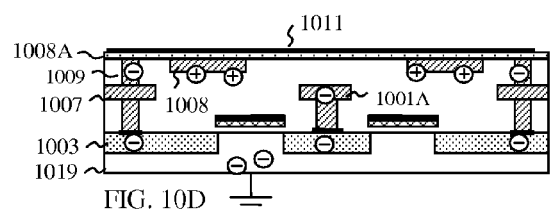
Figure 10E:
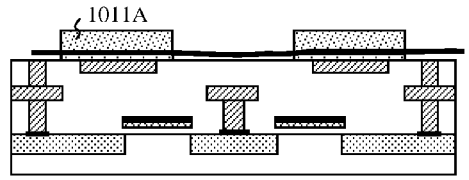
Figure 10F:
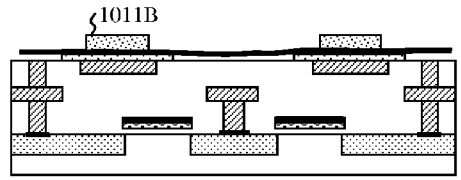

The procedure for forming the carbon nanotube memory cell is illustrated, in FIGS. 10A, 10B, 10C, 10D, 10E, 10F, 10G, 10H, 10I and 10J. The pass transistor is first formed on the wafer, such that the pass transistor is composed of active regions 1001 and 1003, and gate region 1002, as shown in FIG. 10A. And the metal-1 region 1007 as the storage node is formed, and then the metal-2 region 1008 is defined for forming the bottom electrode. In FIG. 10B, contact region 1009 is defined. And then, in FIG. 10C, insulation region, for example, nitride layer 1008A, is deposited for isolating. In FIG. 10D, the carbon nanotube 1011 is deposited on the insulation layer 1008A. Alternatively, the carbon nanotube can be grown. After depositing or growing the carbon nanotubes on the insulation layer 1008A, electric field is applied as explained above, by supplying voltage to the bottom electrode while the substrate 1019 is forced to ground voltage, so that contact region 1009 of the storage node and the bit line node 1001A are discharged to ground voltage, because there are almost no capacitance in the nodes. When higher electric field is applied, the carbon nanotubes are closely aligned on the bottom electrode because the electric field is generated between the storage node and the bottom electrode. In FIG. 10E, photoresistor layer 1011A is defined for removing insulation layer. And then, in FIG. 10F, photoresistor layer 1011B is reduced before depositing metal supporting layer.

Figure 10G:
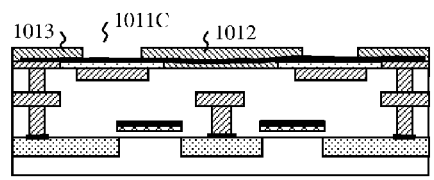
Figure 10I:
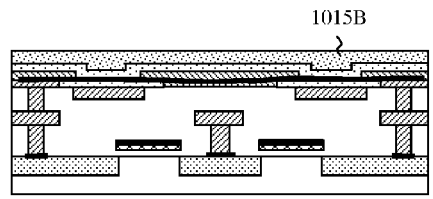
Figure 10H:
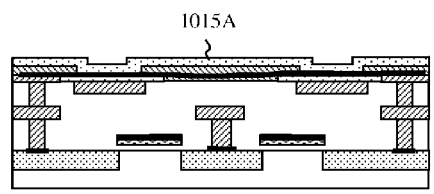
Figure 10J:
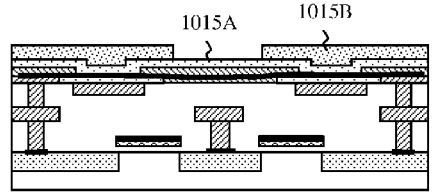
Figure 10K:
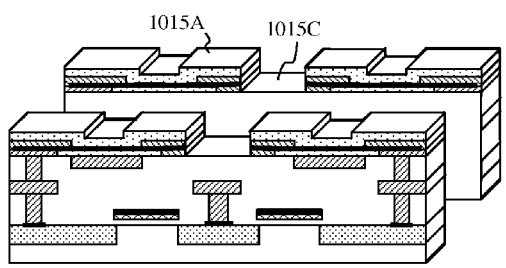
Figure 10L:
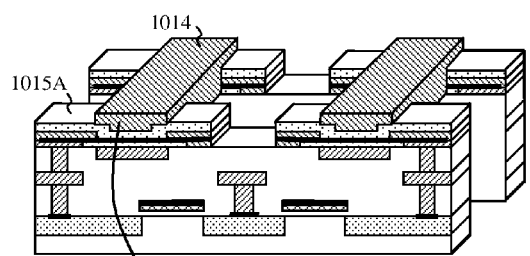
Figure 10M:
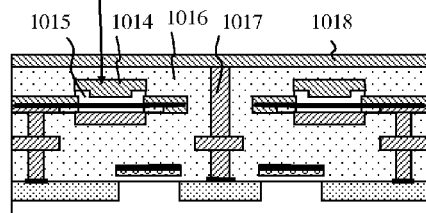

In FIG. 10G, metal supporting layer 1012 and 1013 is depositing for pinning the carbon nanotube. And then in FIG. 10H, photoresistor layer is removed on the bottom electrode region, and insulation layer 1015A is deposited, wherein the insulation layer 1015A is used as a sacrificial layer for forming a gap region as below. In FIG. 10I, photoresistor region 1015B is deposited, and then in FIG. 10J, photoresistor layer 1015B is defined for removing unnecessary portion of the insulation layer 1015A. And FIG. 10K illustrates the remained portion of the insulation layer 1015A, where unnecessary portion of the carbon nanotube and metal layer are also removed in the region 1015C. After then, top electrode metal is defined as shown in FIG. 10L, such that the top electrode region 1014 is formed on the sacrificial (insulation) layer 1015A. After then, the sacrificial layer is selectively etched. And various materials can be used as the sacrificial layer 1015A of gap material such as insulator silicon nitride (Si.sub.3N.sub.4) or semiconductor silicon (Si). And oxide etching may be slightly applied for removing very thin oxide buffer layer on the bottom electrode and the top electrode, alternatively. As a result, in FIG. 10M, the carbon nanotube memory cell is completed, such that the gap region 1015 under the top electrode 1014 is formed after depositing insulation region 1016. After then, the local bit line 1018 is connected to the pass transistor through the bit line contact region 1017.

Figure 11:
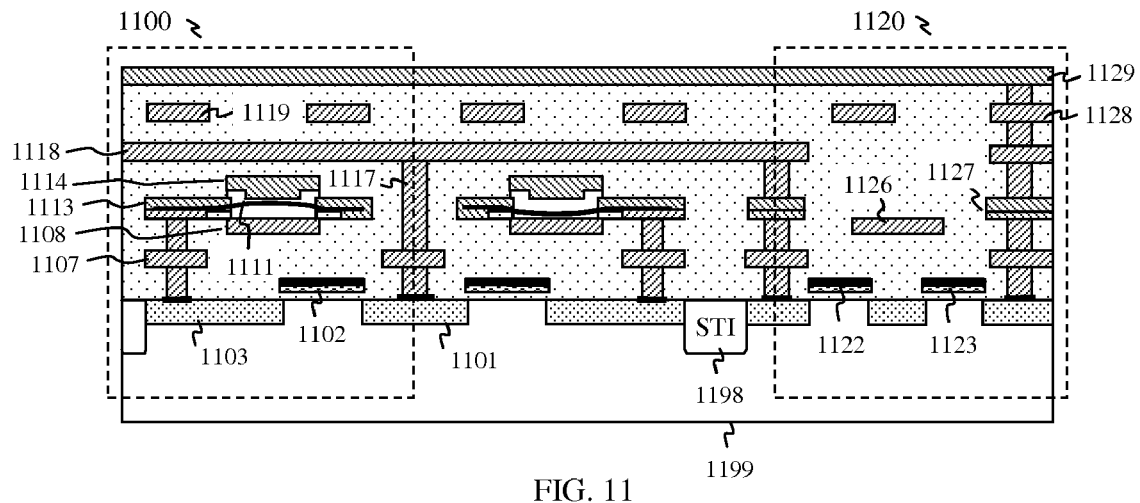
FIG. 11 illustrates an example cross sectional view for the carbon nanotube memory cell, according to the teachings of the present invention.

In FIG. 11, an example cross sectional view for the carbon nanotube memory cell 1100 and peripheral circuit 1120 is illustrated, wherein the memory cell structure is the same as shown in FIG. 9G, a carbon nanotube 1111 is bended to top plate 1114 or bottom plate 1108, and the carbon nanotube 1111 is connected to a drain/source region 1103 of the pass transistor 1102 through the supporting region 1113 and metal-1 region 1107. And the local bit line 1118 is connected to a drain/source region 1101 through bit line contact 1117. The local bit line 1117 is also connected to the write transistor 1122 and another write transistor 1123, and the write global bit line 1129 is connected to the write transistor 1123 through metal regions including metal-6 region 1128. And also metal-6 region 1119 on the memory cell is used as a global word line. And metal-2 region 1126 is formed while aligning the carbon nanotube on the peripheral circuit area with the metal-3 region 1127, which realizes to align the carbon nanotubes uniformly on the wafer. This means that the dummy metal-3 pattern 1126 spreads the carbon nanotubes to the peripheral circuit area. The peripheral circuit 1120 is placed on the same surface of a substrate 1199, where the memory cell area 1100 is isolated from the peripheral circuit region by STI (Shallow Trench Isolation) region 1198.

Figure 12:
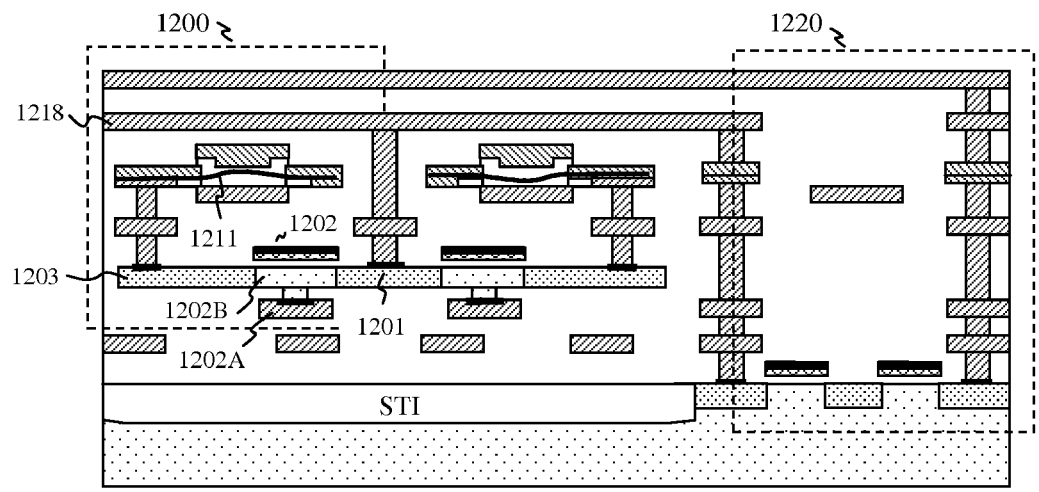
FIG. 12 illustrates alternative memory cell structure for stacking the memory cells, according to the teachings of the present invention.

In FIG. 12, alternative memory cell structure with thin film transistor (TFT) is illustrated, wherein the pass transistor of the memory cell is formed from LTPS (Low Temperature Polycrystalline Silicon) layer, so that the peripheral circuits 1220 are not degraded while forming the memory cell. In particular, body 1202B of the pass transistor is connected to a bias voltage through metal region 1202A, so that the body of the pass transistor is biased, which alleviates self heating problem of the thin film transistor. And sub-threshold leakage current is reduced by forcing a bias voltage to the body. In the memory cell 1200, the carbon nanotube 1211 is connected to active region 1203 of the pass gate 1202. And, another active region 1201 of the pass transistor is connected to the local bit line 1218, and the local bit line 1218 is connected to the peripheral circuit. Alternatively, the transistor can be formed from various semiconductor materials, such as silicon-germanium and germanium.

While the carbon nanotube serves as the storage element, it has also been regarded as ideal interconnect for the chip. There are many reports to use carbon nanotube as the interconnection layer, as published. "Modeling of metallic carbon-nanotube interconnects for circuit simulations and a comparison with Cu interconnects for scaled technologies", Volume 25, Issue 1, January 2006 pp 58-65 IEEE Transactions on Computer-Aided Design of Integrated Circuits and Systems. And "Aligned carbon nanotubes for electrical interconnect and thermal management", Vol. 1 Page(s): 44-50 ECTC "05 (Electronic Components and Technology Conference). In this respect, metallic carbon nanotube may be used for the routing lines, such as the word line, the bit line, and other control signals.

Still furthermore, the carbon nanotube can be useful vias for connecting the routing layers, as published, "Carbon nanotube vias for future LSI interconnects", 7-9 Jun. 2004 pp 251-253. Interconnect Technology Conference, 2004. And "Carbon nanotubes for interconnect applications", page(s): 683-686 IEDM 2004. Hence, metallic carbon nanotube may be used for the vias, such as the word line, the bit line, and other control signals.

While the descriptions here have been given for configuring the memory circuit and structure, alternative embodiments would work equally well with reverse connection such that PMOS transistor can be used as a pass transistor for configuring the memory cell, and signal polarities are also reversed to control the reverse configuration.

The foregoing descriptions of specific embodiments of the invention have been presented for purposes of illustration and description. They are not intended to be exhaustive or to limit the invention to the precise forms disclosed. Obviously, many modifications and variations are possible in light of the above teaching. The embodiments were chosen and described in order to explain the principles and the application of the invention, thereby enabling others skilled in the art to utilize the invention in its various embodiments and modifications according to the particular purpose contemplated. The scope of the invention is intended to be defined by the claims appended hereto and their equivalents.

What is claimed is:

1. A memory device, comprising:
a memory cell including a pass transistor and a carbon nanotube storage element, wherein the carbon nanotube storage element is composed of at least a carbon nanotube disposing in between a bottom electrode and a top electrode; and
a local sense amp including a local write circuit, a local pre amplifier and a local main amplifier, wherein the local write circuit which includes a first write transistor connecting to the local bit line and a second write transistor connecting to the first write transistor; and
the local pre amplifier which includes a local pre-charge transistor for pre-charging a local bit line to a reference voltage for connecting to the memory cell, a local pre-amp transistor for detecting whether the local bit line is higher than the reference voltage or not, and a local pre-amp select transistor for enabling the local pre amp; and
the local main amplifier which includes a local pre-set transistor for pre-setting a local pre-amp node which is connected to the local pre-amp select transistor, and a local main-amp transistor for reading the local pre-amp node; and
a global sense amp including a data read circuit, a data write circuit, a bypass circuit and a data transfer circuit, wherein the data read circuit is connected to the local main-amp transistor through a read global bit line for reading an output of the local sense amp, the data write circuit is connected to the second write transistor of the local sense amp through a write global bit line for writing an input data, the bypass circuit for bypassing the input data, and the data transfer circuit for transferring an output of the data read circuit or an output of the bypass circuit; and
an output latch circuit for receiving an output from the data transfer circuit of the global sense amp; and
a latch control circuit generating a locking signal which is generated by a reference signal based on at least a reference memory cell, in order to lock the output latch circuit.

2. The memory device of claim 1, wherein the local pre amplifier includes the local pre-charge transistor for pre-charging the local bit line, and the local pre-amp transistor for reading the local bit line; and the local main amplifier includes the local pre-set transistor for pre-setting the local pre-amp node connecting to the local pre-amp transistor, the local main-amp transistor for reading the local pre-amp node, and a local main-amp select transistor for enabling the local main amp.

3. The memory device of claim 1, wherein the local pre amplifier includes the local pre-charge transistor for pre-charging the local bit line, and the local pre-amp transistor for reading the local bit line; and the local main amplifier includes the local pre-set transistor for pre-setting the local pre-amp node connecting to the local pre-amp transistor, and the local main-amp transistor for reading the local pre-amp node.

4. The memory device of claim 1, wherein the local pre amplifier includes the local pre-charge transistor for pre-charging the local bit line, and the local pre-amp transistor as a pull-down transistor of an inverter for reading the local bit line and a pull-up transistor of the inverter; and the local main amplifier includes the local main-amp transistor for reading the local pre-amp node.

5. The memory device of claim 1, wherein the local main amplifier is connected to a segment sense amp which is composed of a segment reset transistor for resetting a segment bit line connecting to the local main amplifier, a segment amp transistor for reading the segment bit line, and a segment select transistor for enabling the segment amp transistor.

6. The memory device of claim 1, wherein the local main amplifier is connected to a reduced swing amp as a segment sense amp which is composed of a segment pre-charge transistor for pre-charging a segment bit line connecting to the local sense amp, a segment amp transistor for reading the segment bit line, a segment pre-set transistor for pre-setting an amp node connecting to the segment amp transistor, and a segment main-amp transistor for reading the amp node.

7. The memory device of claim 1, wherein the data read circuit is composed of a global reset transistor for resetting the read global bit line and a read tri-state inverter for reading the read global bit line, the data write circuit is composed of a receive circuit and a write driver, the bypass circuit is composed of a bypass tri-state inverter, and the data transfer circuit is composed of a read inverter.

8. The memory device of claim 1, wherein the first write transistor is controlled by a write control signal which generated by a current detector circuit, such that the current detector circuit detects whether a reference write global bit line is higher than threshold voltage of a current repeat circuit, for disabling the first write transistor when writing.

9. The memory device of claim 1, wherein the latch control circuit receives a latch control signal from an external control circuit and generates the locking signal to lock the output latch circuit.

10. The memory device of claim 1, wherein the latch control circuit includes a tunable delay circuit, such that the tunable delay circuit delays a reference signal for generating the locking signal; and tuning information for the tunable delay circuit is stored in a nonvolatile memory.

11. The memory device of claim 1, wherein the local pre-amp transistor is composed of longer channel length transistor than that of the local pre-set transistor.

12. The memory device of claim 1, wherein the pass transistor of the memory cell is formed from various materials, such as single crystalline silicon, poly crystalline silicon, silicon-germanium, and germanium.

13. The memory device of claim 1, wherein the pass transistor of the memory cell is formed from a thin film transistor and a body of the thin film transistor is connected to a biasing line.

14. The memory device of claim 1, wherein the pass transistor of the memory cell is controlled by a word line which is driven by VPP voltage, where VPP voltage is higher than supply voltage.

15. The memory device of claim 1, wherein the bottom electrode is connected to ground voltage and the top electrode is same voltage as supply voltage of a write driver of the data write circuit; alternatively, the top electrode is connected to ground voltage and the bottom electrode is same voltage as supply voltage of the write driver of the data write circuit.

16. The memory device of claim 1, wherein the top electrode of the memory cell is connected to a current limit transistor and a charge reservoir capacitor, and the bottom electrode of the memory cell is connected to another current limit transistor and another charge reservoir capacitor.

17. The memory device of claim 1, wherein the carbon nanotube is aligned on the bottom electrode by applying electric field when forming the memory cell.

18. The memory device of claim 1, wherein the bottom electrode of the memory cell is convex type for generating electric field when forming the memory cell.

19. The memory device of claim 1, wherein the memory cell is stacked over another memory cell.

20. The memory device of claim 1, additionally comprising at least one compare circuit to configure a content addressable memory; and the compare circuit includes a first transistor set and a second transistor set, wherein a first signal set couples to control a conduction state of the first transistor set and a second signal set couples to control a conduction state of the second transistor set, wherein the first signal set includes stored data in the memory cell and the second signal set includes comparand data from an input device; and at least one compare circuit coupled among the memory cells and at least one match line to receive the first and second signal sets and affect a logical state of the match line, in response to a predetermined logical relationship between the first and second signal sets.

* * * * *